(12) United States Patent
Karnik et al.

(10) Patent No.: US 10,668,435 B2
(45) Date of Patent: Jun. 2, 2020

(54) MITIGATING LEAKS IN MEMBRANES

(71) Applicants:Massachusetts Institute of Technology, Cambridge, MA (US); King Fahd University of Petroleum & Minerals, Dhahran (SA)

(72) Inventors: Rohit N. Karnik, Cambridge, MA (US); Suman Bose, Cambridge, MA (US); Michael S. H. Boutilier, Femont, CA (US); Nicolas G. Hadjiconstantinou, Lexington, MA (US); Tarun Kumar Jain, New York, NY (US); Sean C. O'Hern, Watertown, MA (US); Tahar Laoui, Dhahran (SA); Muataz A. Atieh, Dhahran (SA); Doojoon Jang, Cambridge, MA (US)

(73) Assignees: Massachusetts Institute of Technology, Cambridge, MA (US); King Fahd University of Petroleum & Minerals, Dhahran (SA)

( * ) Notice: Subject to any disclaimer, the term of this patent is extended or adjusted under 35 U.S.C. 154(b) by 0 days.

(21) Appl. No.: 15/878,361

(22) Filed: Jan. 23, 2018

(65) Prior Publication Data

US 2018/0185791 A1    Jul. 5, 2018

Related U.S. Application Data

(63) Continuation of application No. 14/530,292, filed on Oct. 31, 2014, now Pat. No. 9,901,879.

(Continued)

(51) Int. Cl.
*B01D 65/00* (2006.01)
*B01D 65/10* (2006.01)
(Continued)

(52) U.S. Cl.
CPC .......... *B01D 65/003* (2013.01); *B01D 53/22* (2013.01); *B01D 65/108* (2013.01);
(Continued)

(58) Field of Classification Search
CPC .. B01D 71/021; B01D 71/024; B01D 71/025; B01D 69/12; B01D 53/228; B01D 69/10;
(Continued)

(56) References Cited

U.S. PATENT DOCUMENTS 3,839,201 A   10/1974  Miller
3,980,456 A    9/1976  Browall
(Continued)

FOREIGN PATENT DOCUMENTS

CN   102574071 A    7/2012
DE   102010001504 A1  8/2011
(Continued)

OTHER PUBLICATIONS

International Search Report and Written Opinion for PCT/US2013/031963 dated Jun. 11, 2013.
(Continued)

*Primary Examiner* — Ana M Fortuna
(74) *Attorney, Agent, or Firm* — Wolf, Greenfield & Sacks, P.C.

(57) ABSTRACT

Two-dimensional material based filters, their method of manufacture, and their use are disclosed. In one embodiment, a membrane may include an active layer including a plurality of defects and a deposited material associated with the plurality of defects may reduce flow therethrough. Additionally, a majority of the active layer may be free from the material. In another embodiment, a membrane may include a porous substrate and an atomic layer deposited material disposed on a surface of the porous substrate. The atomic layer deposited material may be less hydrophilic than the
(Continued)

porous substrate and an atomically thin active layer may be disposed on the atomic layer deposited material.

25 Claims, 18 Drawing Sheets

Related U.S. Application Data

(60) Provisional application No. 61/898,779, filed on Nov. 1, 2013.

(51) Int. Cl.
*B01D 67/00* (2006.01)
*B01D 53/22* (2006.01)
*B01D 71/02* (2006.01)
*C23C 16/455* (2006.01)
*B01D 69/12* (2006.01)

(52) U.S. Cl.
CPC ....... *B01D 67/0006* (2013.01); *B01D 71/021* (2013.01); *B01D 71/024* (2013.01); *B01D 71/025* (2013.01); *C23C 16/45555* (2013.01); *B01D 69/12* (2013.01); *B01D 2053/221* (2013.01); *B01D 2256/245* (2013.01); *B01D 2257/304* (2013.01); *B01D 2257/504* (2013.01); *B01D 2257/702* (2013.01); *B01D 2323/283* (2013.01); *Y02C 10/10* (2013.01)

(58) Field of Classification Search
CPC .... B01D 71/02; B01D 71/50; B01D 67/0002; B01D 67/0037; B82Y 30/00
See application file for complete search history.

(56) References Cited

U.S. PATENT DOCUMENTS

| | | | |
|---|---|---|---|
| 4,337,154 A | 6/1982 | Fukuchi et al. | |
| 4,767,422 A | 8/1988 | Bikson et al. | |
| 4,894,160 A | 1/1990 | Abe et al. | |
| 5,224,972 A | 7/1993 | Frye et al. | |
| 5,510,176 A | 4/1996 | Nakamura et al. | |
| 5,645,891 A | 7/1997 | Liu et al. | |
| 5,672,388 A | 9/1997 | McHenry et al. | |
| 6,117,341 A | 9/2000 | Bray et al. | |
| 6,730,145 B1 | 8/2004 | Li | |
| 8,361,321 B2 | 1/2013 | Stetson et al. | |
| 8,376,100 B2 | 2/2013 | Avadhany et al. | |
| 9,324,995 B2* | 4/2016 | Ryhanen | H01M 4/131 |
| 9,505,192 B2* | 11/2016 | Stoltenberg | B32B 3/266 |
| 9,901,879 B2* | 2/2018 | Karnik | B01D 53/22 |
| 9,997,778 B2* | 6/2018 | Cao | C30B 5/02 |
| 2002/0088748 A1 | 7/2002 | Allcock et al. | |
| 2003/0185741 A1 | 10/2003 | Matyjaszewski et al. | |
| 2006/0201884 A1 | 9/2006 | Kulprathipanja et al. | |
| 2007/0017861 A1 | 1/2007 | Foley et al. | |
| 2007/0256562 A1 | 11/2007 | Routkevitch et al. | |
| 2008/0020197 A1 | 1/2008 | Ayers et al. | |
| 2008/0149561 A1 | 6/2008 | Chu et al. | |
| 2009/0000651 A1 | 1/2009 | Qiao | |
| 2009/0120874 A1 | 5/2009 | Jensen et al. | |
| 2009/0155678 A1 | 6/2009 | Less et al. | |
| 2009/0321355 A1 | 12/2009 | Ratto et al. | |
| 2010/0212504 A1 | 8/2010 | Shimizu et al. | |
| 2011/0056892 A1 | 3/2011 | Strauss et al. | |
| 2011/0108521 A1* | 5/2011 | Woo | B82Y 30/00 216/36 |
| 2011/0139707 A1 | 6/2011 | Siwy et al. | |
| 2011/0223494 A1 | 9/2011 | Feaver et al. | |
| 2012/0000845 A1 | 1/2012 | Park et al. | |
| 2012/0048804 A1 | 3/2012 | Stetson et al. | |
| 2012/0108418 A1 | 5/2012 | Nair et al. | |
| 2012/0171376 A1 | 7/2012 | Dodge | |
| 2012/0186980 A1 | 7/2012 | Mishra et al. | |
| 2012/0255899 A1 | 10/2012 | Choi et al. | |
| 2012/0295091 A1 | 11/2012 | Behabtu et al. | |
| 2013/0040283 A1 | 2/2013 | Star et al. | |
| 2013/0105417 A1* | 5/2013 | Stetson | C02F 1/442 210/806 |
| 2013/0192460 A1 | 8/2013 | Miller et al. | |
| 2013/0192461 A1 | 8/2013 | Miller et al. | |
| 2013/0270188 A1 | 10/2013 | Karnik et al. | |
| 2013/0305927 A1 | 11/2013 | Choi et al. | |
| 2013/0309776 A1* | 11/2013 | Drndic | G01N 27/26 436/94 |
| 2013/0314844 A1 | 11/2013 | Chen et al. | |
| 2014/0030482 A1* | 1/2014 | Miller | B01D 65/108 428/139 |
| 2014/0138314 A1 | 5/2014 | Liu et al. | |
| 2014/0262820 A1* | 9/2014 | Kuan | C25F 3/14 205/665 |
| 2014/0263035 A1 | 9/2014 | Stoltenberg et al. | |
| 2014/0272286 A1 | 9/2014 | Stoltenberg et al. | |
| 2014/0311967 A1 | 10/2014 | Grossman et al. | |
| 2014/0332814 A1 | 11/2014 | Peng et al. | |
| 2015/0010714 A1 | 1/2015 | Appleton et al. | |
| 2015/0044556 A1* | 2/2015 | Wang | H01M 4/366 429/213 |
| 2015/0122727 A1* | 5/2015 | Karnik | B01D 53/22 210/500.21 |
| 2015/0224451 A1 | 8/2015 | Miyahara et al. | |
| 2015/0231557 A1 | 8/2015 | Miller et al. | |
| 2015/0273401 A1* | 10/2015 | Miller | B01D 67/0037 210/500.25 |
| 2016/0009049 A1* | 1/2016 | Stoltenberg | B32B 9/045 428/137 |
| 2016/0051942 A1 | 2/2016 | Park et al. | |
| 2016/0231307 A1* | 8/2016 | Xie | G01N 27/4473 |
| 2016/0340797 A1* | 11/2016 | Ozyilmaz | C30B 1/02 |
| 2017/0021366 A1* | 1/2017 | Chapman | B03C 5/005 |
| 2017/0154975 A1* | 6/2017 | Liu | H01L 21/0212 |
| 2017/0175258 A1* | 6/2017 | Robinson | C23C 14/0623 |
| 2017/0296972 A1* | 10/2017 | Sinton | B01D 71/021 |
| 2017/0368508 A1 | 12/2017 | Grossman et al. | |
| 2018/0071684 A1* | 3/2018 | Nair | B01D 69/02 |
| 2018/0185791 A1* | 7/2018 | Karnik | B01D 53/22 |

FOREIGN PATENT DOCUMENTS

| | | |
|---|---|---|
| EP | 2511002 A1 | 10/2012 |
| WO | WO 2004/085043 A1 | 10/2004 |
| WO | WO 2010/030382 A1 | 3/2010 |
| WO | WO 2010/043914 A2 | 4/2010 |
| WO | WO 2010/126686 A2 | 11/2010 |

OTHER PUBLICATIONS

International Search Report and Written Opinion dated Jul. 28, 2014 for PCT/US2014/027309.
Extended European Search Report for Application No. EP 14856983.3 dated Jun. 7, 2017.
Invitation to Pay Additional Fees for PCT/US2014/063301 dated Jan. 28, 2015.
International Search Report and Written Opinion for PCT/US2014/063301 dated Mar. 20, 2015.
International Preliminary Report on Patentability for Application No. PCT/US2014/063301 dated May 12, 2016.
Aleman et al., "Transfer-Free Batch Fabrication of Large-Area Suspended Graphene Membranes," ACSNANO, vol. 4, No. 8, pp. 4762-4768 (Jul. 6, 2010).
Allen et al., Honeycomb carbon: a review of graphene. Chem Rev. Jan. 2010;110(1):132-45. doi: 10.1021/cr900070d, Epub Jul. 17, 2009.
Apel, Invited Talk: Track etching technique in membrane technology. Radiation Measurements. 2001. 34: 559-66.
Bagri et al. Structural evolution during the reduction of chemically derived graphene oxide. Nat Chem. 2010; 2:581-587.
Beu et al., Model analysis of the fragmentation of large $H_2O$ and $NH_3$ clusters based on MD simulations. Eur Phys J D. Dec. 2003;27(3):223-9. doi: 10.1140/epjd/e2003-00268-4.

(56) References Cited

OTHER PUBLICATIONS

Bhattacharya et al., Grafting: a versatile means to modify polymers; Techniques, factors, and applications. Prog Polym Sci. 2004; 29:767-814.
Blankenburg et al., Porous graphene as an atmospheric nanofilter. Small. Oct. 2010;6(20):2266-71.
Boukai et al. Efficiency enhancement of copper contaminated radial p-n junction solar cells. Chem Phys Lett. 2011; 501:153-158.
Boutilier et al., Implications of Permeation through Intrinsic Defects in Graphene on the Design of Defect-Tolerant Membranes for Gas Separation. ACS Nano. 2014. 891): 841-9.
Bowden, A perspective on resist materials for fine line lithography. Materials for Microlithography, Advances in Chemistry Series, #266, American Chemical Society, Washington, D.C.. 1984; Chapter 3:39-117.
Chang et al. Densely packed arrays of ultra-high-aspect-ratio silicon nanowires fabricated using block-copolymer lithography and metal-assisted etching. Adv Funct Mater. 2009; 19:2495-2500.
Chowdhury et al. Fullerenic nanostructures in flames. J Mater Res. 1996; 11:341-347.
Chu, Plugging up leaky graphene. MIT News. May 8, 2015, 3 pages. Http://news.mit.edu/2015/repair-graphene-leaks-0508.
Cohen-Tanugi et al., "Water Desalination Across Nanoporous Graphene," Nano Letters, vol. 12, pp. 3602-3608 (2012).
Cohen-Tanugi et al., Quantifying the potential of ultra-permeable membranes for water desalination. Energy & Environmental Science. 2014; 7:1134-1141.
Deng et al. Developments and new applications of UV-induced surface graft polymerizations. Progress in Polymer Science. 2009; 34(2):156-193.
Du et al., Separation of Hydrogen and Nitrogen Gases with Porous Graphene Membrane. J of Physical Chemistry. 2011.115: 23261-6.
Erickson et al. Determination of the local chemical structure of graphene oxide and reduced graphene oxide. Adv Mater. 2010; 22:4467-4472.
Fang et al. Modification of polyethersulfone membrane by grafting bovine serum albumin on the surface of polyethersulfone/poly(acrylonitrile-co-acrylic acid) blended membrane. Journal of Membrane Science. Mar. 2009; 329:46-55.
Fang et al. Pore size control of ultrathin silicon membranes by rapid thermal carbonization. Nano Lett. 2010; 10:3904-3908.
Fischbein et al., Electron beam nanosculpting of suspended graphene sheets. Applied Physics Letters. 2008. 93: 113107.
Goel et al. Size analysis of single fullerene molecules by electron microscopy. J Carbon. 2004; 42:1907-1915.
Grantab et al., Anomalous strength characteristics of tilt grain boundaries in graphene. Science. 2010; 330(6006):946-48.
Henis et al., Composite hollow fiber membranes for gas separation: the resistance model approach. Journal of Membrane Science. 1981. 8: 233-46.
Jiang al., "Porous Graphene as the Ultimate Membrane for Gas Separation," Nano Letters, vol. 9, No. 12, pp. 4019-4024 (Sep. 23, 2009).
Joung et al., Determination of alkali and halide monovalent ion parameters for use in explicitly solvated biomolecular simulations. J Phys Chem B, 2008, 112(30):9020-41, doi: 10/1021/jp8001614. Epub Jul. 2, 2008.
Kemmell et al. Transparent superhydrophobic surfaces by self-assembly of hydrophobic monolayers on nanostructured surfaces. Phys Stat Sol (a). 2006; 203:1453-1458.
Kholmanov et al., Improved electrical conductivity of graphene films integrated with metal nanowires. Nano Lett. Nov. 14, 2012;12(11):5679-83. doi: 10.1021/nl302870x.
Kim et al., Applications of atomic layer deposition to nanofabrication and emerging nanodevices. Thin Solid Films. 2009; 517:2563-2580.
Kim et al., Fabrication and Characterization of Large-Area, Semiconducting Nanoperforated Graphene Materials. Nano Letters. 2010. 10: 1125-31. DOI: 10.1021/nl9032318.
Kim et al., Selective gas transport through few-layered graphene and graphene oxide membranes. Science. Oct. 4, 2013; 342:91-94.
Koenig et al., "Selective Molecular Sieving Through Porous Graphene," Nature NanoTechnology, vol. 7, pp. 728-732 (Nov. 2012).
Lee et al. Measurement of the elastic properties and intrinsic strength of monolayer graphene. Science. 2008; 321(5887):385-88.
Lehtinen et al., "Effects of Ion Bombardment on a Two-Dimensional Target: Atomistic Simulations of Graphene Irradiation," Physical Review B, vol. 81, pp. 153401.01-153401.04 (2010).
Lerf et al. Hydration behavior and dynamics of water molecules in graphite oxide. J Phys Chem Sol. 2006; 67:1106-1110.
Li et al., Ultrathin, molecular-sieving graphene oxide membranes for selective hydrogen separation. Science. Oct. 4, 2013; 342:95-98.
Liu et al., Two-Dimensional-Material Membranes: A New Family of High-Performance Separation Membranes. Angew Chem Int Ed Engl. Oct. 17, 2016;55(43):13384-13397. doi: 10.1002/anie.201600438. Epub Jul. 1, 2016.
Merchant et al., DNA translocation through graphene nanopores. Nano Lett. 2010;10(8):2915-21.
Min et al., Mechanical properties of graphene under shear deformation. Applied Physics Letters. 2011; 98(1).
Mooney et al. Simulation studies for liquid phenol: properties evaluated and tested over a range of temperatures. Chem Phys Lett. 1998; 294:135-142.
Muller-Plathe, Local structure and dynamics in solvent-swollen polymers. Macromolecules. 1996;29(13):4782-91.
Nyyssonen, Optical Linewidth measurement on patterned wafers. SPIE Proceedings, Integrated Circuit Metrology. 1984; 480:65.
O'Hern et al., Selective molecular transport through intrinsic defects in a single layer of CVD graphene. ACS Nano. Nov. 27, 2012;6(11):10130-8.
Pendergast et al., A review of water treatment membrane nanotechnologies. Energy Environ Sci. 2011; 4:1946-1971.
Prabhu et al. SEM-induced shrinking of solid-state nanopores for single molecule detection. Nanotech. 2011; 22:425302-425311.
Russo et al., "Atom-By-Atom Nucleation and Growth of Graphene Nanopores," PNAS, vol. 109, No. 16, pp. 5953-5957 (Apr. 17, 2012).
Schrier, Carbon dioxide separation with a two-dimensional polymer membrane. ACS Appl Mater Interfaces. Jul. 25, 2012;4(7):3745-52.
Singh et al. Modification of regenerated cellulose ultrafiltration membranes by surface-initiated atom transfer radical polymerization. Journal of Membrane Science. 2008; 311:225-234.
Sint et al., Selective ion passage through functionalized graphene nanopores. J Am Chem Soc. Dec. 10, 2008;130(49):16448-9.
Storm et al. Fabrication of solid-state nanopores with single-nanometre precision. Nat Mater Lett. 2003; 2:537-540.
Suess, Abundances of the elements. Reviews of Modern Physics. 1956; 18:53-74.
Suk et al., "Water Transport Through Ultrathin Graphene," J. Phys. Chem. Lett., vol. 1, pp. 1590-1594 (Apr. 30, 2010).
Sun et al., Selective ion penetration of graphene oxide membranes. ACS Nano. Jan. 22, 2013;7(1):428-37.
Taffa et al. Pore size and surface charge control in mesoporous $TiO_2$ using post-grafted SAMs. Phys Chem Chem Phys. 2010; 12:1473-1482.
Ulman, Formation and structure of self-assembled monolayers. Chem Rev. 1996; 96:1533-1554.
Van Den Haut et al. Controlling nanopore size, shape and stability. Nanotech. 2010; 21:115304-115309.
Venkatesan et al. Highly sensitive, mechanically stable nanopore sensors for Dna analysis. Adv Mater. 2009;21(27):2771-6. 14 pages.
Yoon et al., Graphene-based membranes: status and prospects. Philos Trans A Math Phys Eng Sci. Feb. 13, 2016;374(2060). pii: 20150024. doi: 10.1098/rsta.2015.0024.
Zhu et al. Surface modification of PVDF porous membranes via poly(DOPA) coating and heparin immobilization. Colloids Surf B Biointerfaces. Feb. 15, 2009;69(1):152-5. doi: 10.1016/j.colsurfb.2008.11.011. Epub Nov. 25, 2008.
Han et al., Ultrathin graphene nanofiltration membrane for water purification. Advanced Functional Materials. Aug. 7, 2013; 23(29):3693-3700. doi:10.1002/ADFM.201202601.

(56) References Cited

OTHER PUBLICATIONS

Boutilier et al., Molecular Sieving Across Centimeter-Scale Single-Layer Nanoporous Graphene Membranes. ACS Nano. Jun. 27, 2017;11(6):5726-5736. doi:10.1021/acsnano.7b01231. Epub Jun. 13, 2017. Supplementary Information. 28 pages.
Oh et al., Design of pressure-driven microfluidic networks using electric circuit analogy. Lab Chip. Feb. 7, 2012;12(3):515-45. doi: 10.1039/c21c20799k. Epub Dec. 16, 2011. Review.
Wang et al., Fundamental transport mechanisms, fabrication and potential applications of nanoporous atomically thin membranes. Nat Nanotechnol. Jun. 6, 2017;12(6):509-522. doi: 10.1038/nnano.2017.72. Review.

\* cited by examiner

MITIGATING LEAKS IN MEMBRANES

CROSS-REFERENCE TO RELATED APPLICATIONS

This application is a continuation of U.S. application Ser. No. 14/530,292, filed Oct. 31, 2014, which claims the benefit under 35 U.S.C. § 119(e) of U.S. provisional application Ser. No. 61/898,779, filed Nov. 1, 2013, the disclosures of which are incorporated by reference in their entirety.

GOVERNMENT LICENSE RIGHTS

This invention was made with government support under Grant No. DE-SC0008059 awarded by the Department of Energy. The government has certain rights in the invention.

FIELD

Disclosed embodiments are related to mitigating leaks in membranes

BACKGROUND

Many industries and applications, such as water purification, chemical synthesis, pharmaceutical purification, refining, natural gas separation, and many other applications rely on energy-intensive membrane separation as a major component of their processes. The need for membranes with high selectivity and flux for both liquid-phase and gas-phase membranes has led to many improvements in ceramic and polymer-based membranes over the past few decades. One of the primary challenges has been maximizing flux while maintaining high selectivity. Typically, increasing flux rate necessitates a decrease in selectivity. While several decades of research has resulted in development of polymeric or ceramic membranes, further advances in membrane technology will likely rely on new membrane materials that provide better transport properties. Recent advances in two-dimensional (2D) materials such as graphene have opened new opportunities to advance membrane technology, where these 2D materials can form the active layer that confers selectivity.

SUMMARY

In one embodiment, a membrane may include an active layer including a first plurality of defects and a deposited material associated with the first plurality of defects. The material may reduce flow through the first plurality of defects, and a majority of the active layer may be free from the material.

In another embodiment, a method of forming a membrane may include depositing a material to reduce flow through a first plurality of defects in an active layer where a majority of the layer is free from the material.

In yet another embodiment, a method of forming a membrane may include: depositing a material using atomic layer deposition onto a porous substrate where the material is less hydrophilic than the porous substrate; and bonding an atomically thin active layer to the porous substrate.

In another embodiment, a membrane may include a porous substrate and an atomic layer deposited material disposed on a surface of the porous substrate. The atomic layer deposited material may be less hydrophilic than the porous substrate. The membrane may also include an atomically thin active layer disposed on the atomic layer deposited material.

It should be appreciated that the foregoing concepts, and additional concepts discussed below, may be arranged in any suitable combination, as the present disclosure is not limited in this respect. Additionally, the foregoing and other aspects, embodiments, and features of the present teachings can be more fully understood from the following description in conjunction with the accompanying drawings.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
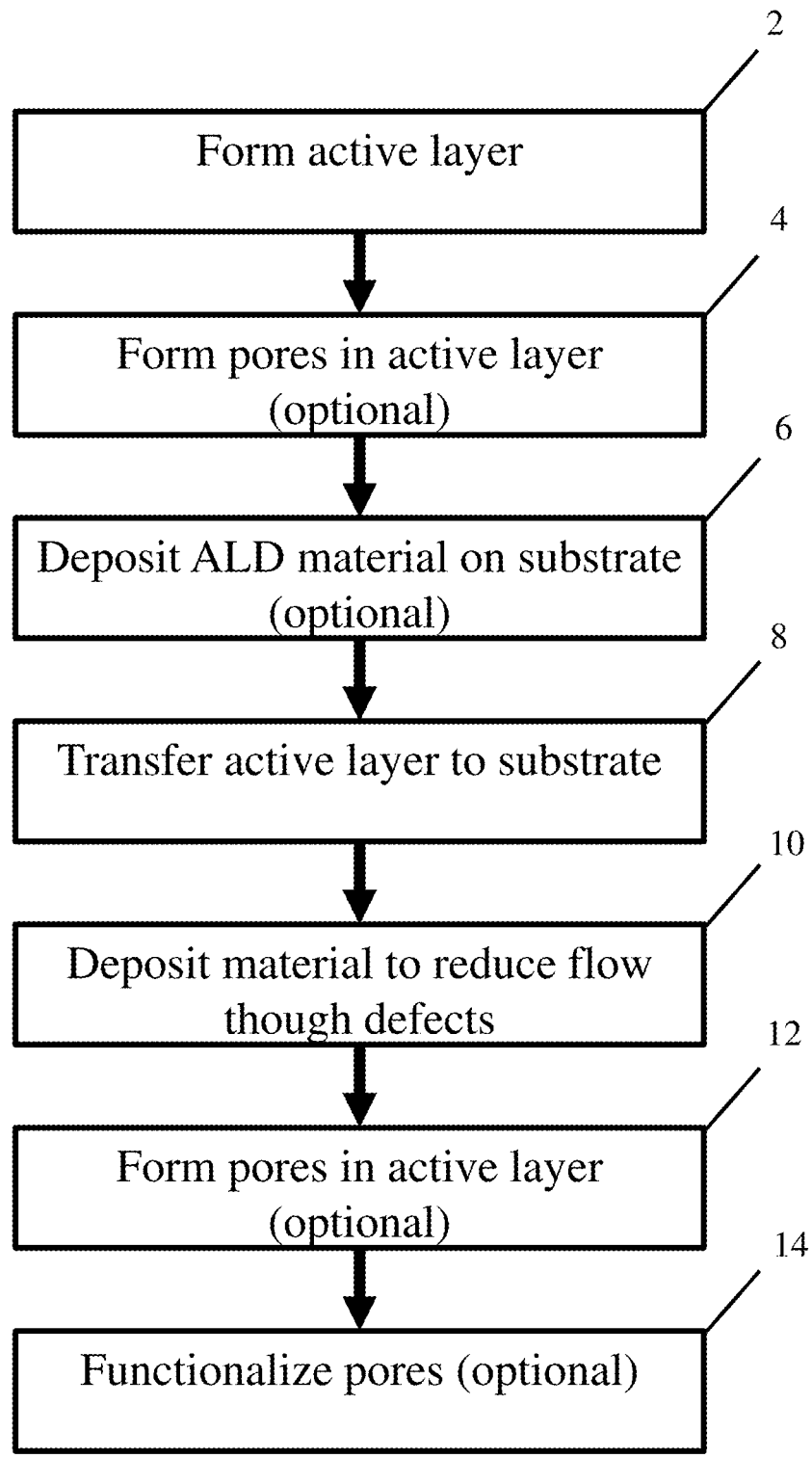
FIG. 1 is a schematic flow diagram of a method for forming a membrane.

The inventors have recognized that two-dimensional atomically-thin materials including a single, or in some instances several, atomic layers, have immense potential as a highly-permeable, highly-selective filtration membranes. Due to the ability to create angstrom and nanometer scale pores in a single sheet of these materials, two dimensional materials have the ability to effectively and efficiently permit selective transport of molecules for filtration in liquid and gas separation processes. Additionally, and without wishing to be bound by theory, the ultrathin thicknesses associated with these materials may permit extremely high permeance and corresponding flow rates while maintaining better selectivity as compared to less-organized polymeric membranes. However, in addition to the benefits associated with using atomically thin membranes, the inventors have recognized that one of the primary challenges facing their development for use is the presence of intrinsic defects introduced during manufacturing of the material and extrinsic defects introduced during transferring processes of these materials onto porous support substrates, as well as larger pores introduced during selective pore formation processes. These defects typically exhibit a broad size distribution which can range from about 1 nm up to several nanometers, or even from micrometers to millimeters, and may allow free transport of most ions, solutes, and gases across an active layer made from these materials. Further, unlike membranes of finite thickness, atomically thin materials are more susceptible to leakage through these defects and will correspondingly exhibit decreased net selectivity when these types of defects are present.

In view of the above, the inventors have recognized that it may be desirable to reduce, or eliminate, leakage through the noted defects. Additionally, it may also be beneficial to provide a membrane active layer including monodisperse pores in applications such as nanofiltration, reverse osmosis, and other membrane applications to provide a desired level of selectivity. Consequently, the inventors have recognized the benefits associated with selectively depositing a material into the pores of a supporting substrate and/or on or within the defects in an active layer to reduce flow through these nonselective leakage paths. As described in more detail below, in some of embodiments, atomic layer deposition, chemical vapor deposition, and/or an interfacial reaction may be used to deposit a selected material to reduce flow through the defects. Depending on the embodiment, the defects may be sealed during the manufacturing process and/or during a repair after the membrane has been in service. Selective pores of a desired size may also be introduced into the active layer either prior to, or after, sealing the defects to provide a desired selectivity.

For the sake of clarity, the embodiments and examples described below are primarily directed to use of graphene. However, the methods and membranes described herein are not so limited. For example, appropriate materials may also include hexagonal boron nitride, molybdenum sulfide, vanadium pentoxide, silicon, doped-graphene, graphene oxide, hydrogenated graphene, fluorinated graphene, covalent organic frameworks, layered transition metal dichalcogenides (eg. MoS2, TiS2, NiO2, etc.), layered Group-IV and Group-III metal chalcogenides (eg. SnS, PbS, GeS, etc), silicene, germanene, and layered binary compounds of Group IV elements and Group III-V elements (e.g. SiC, GeC, SiGe), and any other appropriate atomically thin material. Additionally, in some embodiments the methods described herein may be applied to the production of thicker non-atomically thin membrane materials such as graphene containing multiple atomic layers, graphene oxide containing multiple atomic layers, metal organic frameworks, thin-layer atomic layer deposition of metal oxides ($AlO_2$, $HfO_2$, etc), zeolites, and other appropriate materials as well.

Without wishing to be bound by theory, these methods of reducing flow through defects in atomically thin materials may help to enable the production of highly selective membranes comprising a single atomically thin selective layer without the need to stack multiple atomically thin layers together to reduce leakage pathways. However, it should be understood that these methods may also be used with membranes including multiple layers of atomically thin materials. Additionally, while the embodiments described herein are directed to atomically thin materials, the disclosed methods could also be applied to membranes with finite thickness as well.

In other embodiments, atomic layer deposition of a material onto a porous substrate might be used to control the hydrodynamic resistance of the pores in the porous substrate to restrict flow through the defects in an associated active layer. Again, without wishing to be bound by theory, the ability to tune a substrate's pore diameter via atomic layer deposition may help to improve selectivity of the overall resulting membrane.

In yet another embodiment, atomic layer deposition of material onto a porous substrate may be used to modify the surface characteristics of the substrate to improve the transfer of an active layer onto the substrate. For example, the substrate may have a hydrophilic surface and the atomically are deposited material may be more hydrophobic than the substrate surface to reduce wicking of an etchant between the substrate and an active layer during the transfer process. This may lead to enhanced bonding between the substrate and active layer as well as reduced leakage through the membrane due to the active layer not appropriately adhering to the substrate.

As will become more evident in view of the description below, the disclosed methods and membranes may help to enable the use of atomically thin materials as molecular sieves for gas-phase or liquid-phase separation processes by reducing or eliminating the permeance of non-selective, uncontrolled holes through mechanisms such as plugging the defects or minimizing their impact on membrane transport properties. Additionally, the disclosed methods of manufacture, and the resulting membranes, may be applied to any number of different applications. For example, some commercial applications of the described membranes include, but are not limited to: water purification to remove pathogens, organic molecules, and salts (desalination/softening); portable water filters; preconcentrators for liquid or gas samples for use in sensing applications; gas separation in energy applications such as natural gas separation (methane from carbon dioxide, hydrogen sulfide, and heavier hydrocarbons) and carbon sequestration; dialysis in biological research; medical implants for allowing only select molecules to go through (e.g., for sensor applications); controlled drug release devices; and in fuel cells as proton-selective membranes to name a few.

Turning now to the figures, specific non-limiting embodiments are described in more detail. It should be understood that various features of the separately described embodiments may be used together as the current disclosure is not limited to the specific embodiments depicted in the figures and described below.

FIG. 1 depicts a generalized flow diagram for manufacturing a membrane. More detailed descriptions of the various steps are provided below in reference to the other figures. In step 2, an active layer for use in a membrane is formed. The layer may be an atomically thin layer of material and may be formed using any appropriate technique. After forming the active layer, pores may optionally be formed in the active player prior to transferring the active layer to a substrate, see 4. Depending on the embodiment, the pores may be sub-nanopores, nanopores, or micropores. The active layer may be transferred and subsequently bonded to an appropriate substrate at 8 using any appropriate transfer technique. However, in some embodiments, prior to transferring the layer to a substrate at 8, the substrate may be treated with an atomic layer deposited material to increase the flow resistance of pores in the substrate and/or to alter the surface of the substrate to enhance bonding with the active layer deposited there on. After bonding the active layer to the substrate, material may be deposited to reduce flow through defects present in the active layer at 10 using any appropriate method as discussed in more detail below. Additionally, the material may either be deposited within the defects, on top of the defects on the active layer, within an associated substrate, or in any other appropriate location depending on the deposition method used. While this step has been shown to be performed after transferring the active layer to the substrate, it is possible that depositing material to reduce flow through the defects could be performed prior to the active layer being transferred to the substrate. Additionally, in some embodiments, pores may be formed in the active layer at 12 subsequent to the material being deposited to reduce flow through the defects, though as noted above and indicated by step 4, the pores me also be formed at an earlier step. Additionally, the pores may optionally be functionalized to enhance a desired characteristic of the resulting membrane at 14.

Figure 2:
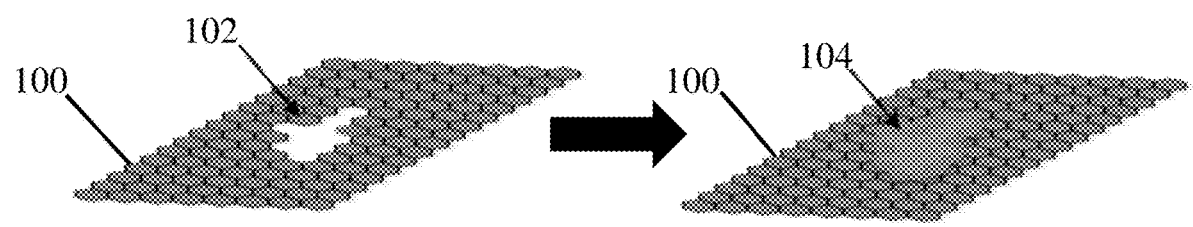
FIG. 2 is a schematic perspective view of sealing a defect in an active layer.

The general concept of depositing a material to reduce flow through a defect is illustrated in FIG. 2. As illustrated in the figure, an active layer 100 includes a defect 102. As noted above, the defect may be on the order of several nanometers up to, and possibly greater than, several micrometers. In order to reduce flow of a desired material through the defect 102, for example hydrogen, a material is deposited into, or on top of, the defect 102 to form a plug 104. In some instances, the plug 104 may completely fill or cover the defect 102 to reduce a flow of a gas or liquid there through. However, in some instances, the plug 104 may only partially fill the defect 102. In such an instance, the defect 102 may be substantially filled such that a reduction in the open area of the defect is still sufficient to reduce a flow of a desired gas or liquid there through. As illustrated in the figure, the material used to form the plug 104 is preferentially deposited at the site of the defect 102 leaving the majority of the active layer surface free of the deposited material. As described in more detail below, the material used to form the plug 104 may be deposited in any number of ways including, but not limited to, an interfacial reaction, atomic layer deposition, and chemical vapor deposition.

In embodiments using an interfacial reaction, a polymer, mineral, or any other solid deposit capable of reducing the flow of a desired gas or liquid is formed using a self-limiting chemical or precipitation reaction at the interface between two separate phases containing reacting monomers or components. Without wishing to be bound by theory, wherever the two separate phases contact one another, they form or precipitate the desired material. Therefore, by controlling the location of an interface between these two phases relative to the active layer, it is possible to control the location at which the material is formed or precipitated. For example, the interface may be located either on a surface of the active layer or within the active layer such that the deposited material is deposited on, or in, the defects themselves. Additionally, to facilitate manufacture and use of these membranes, the deposited material used to seal the defects may be insoluble in the first phase, the second phase, and/or a phase that the membrane will be subjected to during use.

Figure 3A:
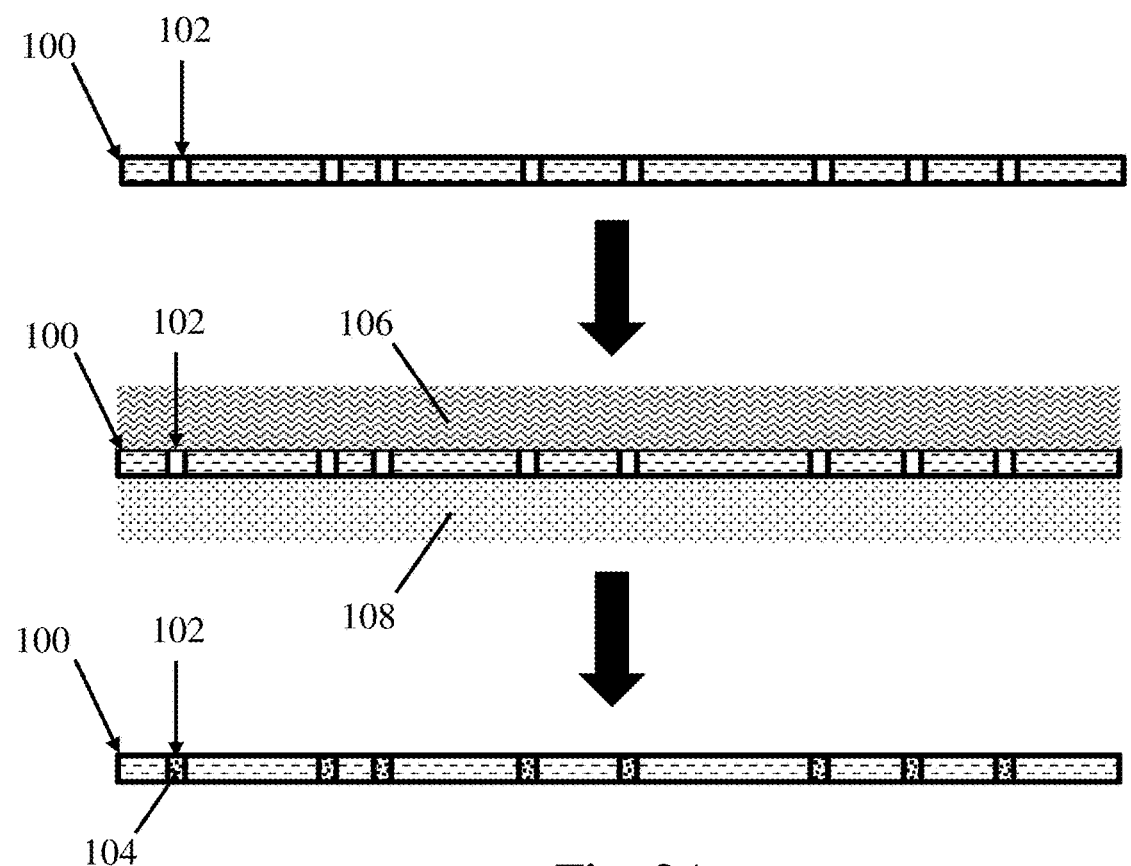
FIG. 3A is a schematic cross-sectional view of sealing a defect in an active layer using an interfacial reaction.

One such embodiment is illustrated in FIG. 3A which depicts an active layer 100 including a plurality of defects 102. The active layer 100 is arranged such that a first phase 106 is located on one side of the graphene layer and a second phase 108 is located on an opposing second side of the active layer. As noted above, the first phase reacts with the second phase to form a precipitant or other product at their interface. If the two phases are not appropriately controlled, the interface between the phases may be located past a surface of the active layer 100 and the material formed may not be deposited in the desired locations. Parameters that may be used to control the location of the interface include, but are not limited to, a pressure on either side of the active layer, a surface tension of the phases with the active layer and/or support substrate, a functionalization of the active layer and/or support substrate, concentrations or pressures of components in the phases, choice of solvent if performed in liquid phase or choice of background inert gas if performed in gas phase, and a radius of the support substrate to name a few. For example, and without wishing to be bound by theory, functionalizing one side of the active layer to be hydrophobic and the other side to be hydrophilic may be pin the interface at the plane of the active layer. By appropriately using the above-noted control parameters, the interface between the two phases may be located either in, or on a surface of the active layer 100. Thus, the reaction, and the deposited material, may be restricted to places where holes, cracks, or other defects 102 in the active layer allow the two phases to come into contact. The material formed or precipitated at these locations seals the defects 102 with plugs 104. Because the reaction is restricted to where the defects are located, the remaining portion of the active layer 100 may be substantially free from the deposited material. Selective nanopores, or pores with other desired sizes, can then be introduced into the active layer to create a highly selective filtration membrane.

In embodiments similar to the one discussed above, the location and ability to seal a membrane using certain types of interfacial reactions may depend on the relative concentrations of the reactants. For example, the interfacial reaction of reactants having homobifunctional end groups (e.g. one monomer with amine end groups and another with acyl chloride) occurs where the fluxes of the two monomers have the correct stoichiometry. In the instance of aqueous and organic phase monomers, the aqueous phase monomer is typically soluble in the organic phase, and the polymer is deposited in the organic phase. Without wishing to be bound by theory, if the monomers are denoted by x-A-x and y-B-y where x and y are reactive groups, the monomer to formed would be -A-B-A-B-. However, if the number of B monomers is much greater, for example more than twice, the number of A monomers at a particular location, the A monomers will tend to react with the excess B monomers to yield y-B-A-B-y molecules that are unable to form longer polymer chains. Therefore, the polymer will form only when the fluxes of the reactants are approximately matched to form a stoichiometric mix of reactants. While a reaction for monomers include two reactive groups have been described above, the use of a stoichiometric mix of reactants to facilitate the desired interfacial reaction may be applied to monomers having more than two reactive groups as well as other types of reactants though the relative flux ratios of the reactants may be somewhat different for different reactants.

In view of the above, if the fluxes of reactants used in an interfacial reaction are mismatched, the resulting polymer, or other material, may form outside the composite membrane or it may not form at all. For example, if graphene with a 5 nm defect is suspended on polycarbonate pore membrane with 200 nm diameter pores, and an aqueous monomer solution x-A-x is introduced on the graphene side, it will have insufficient flux compared to the monomer y-B-y introduced on the polycarbonate track-etched membrane side to form a stoichiometric mix of reactants within the composite membrane. As a result, both reactive groups of the monomer will be consumed and the result will be primarily the formation of y-B-A-B-y instead of a polymer inside of the composite membrane. However, if the flux of reactants within the composite membrane controlled by appropriately controlling the transport resistances of the support filter versus the defects in the atomically thin active layer the product from the mixture of the various reactants may be deposited within the composite membrane. Therefore, in some embodiments, the transport resistance of a supporting filter may be greater than or equal to the transport resistance of defects located within an active layer to facilitate formation of a stoichiometric mix of reactants within a composite membrane. For example, in the above case of an active layer having 5 nm defects, a polycarbonate track-etched membrane with smaller 10 nm pores will decrease the flux of monomer B so that the interfacial polymerization will be located within the composite membrane and will favor the formation of the desired polymer. Alternatively, in some embodiments, a similar result may be obtained by increasing the concentration of A and/or decreasing the concentration of B to provide the desired flux of reactants within the composite membrane.

While several specific embodiments to control the flux of reactants are described above, it should be understood that any appropriate combination of transport resistances of the active layer and/or support as well as the relative concentrations of reactants in the various phases may be used to provide a stoichiometric flux of reactants within the composite membrane to produce the desired interfacial reaction.

It should be noted that the interfacial reactions may be performed using any number of monomers having two or more reactive groups. For example, in some embodiments, an interfacial reaction of a polyamide may be performed using monomers such as amines and acyl chlorides. Appropriate monomers that may be used include, but are not limited to, trimesoyl chloride, polyhedral oligomeric silsesquioxane amine, phenylenediamine, propane-1,2,3-triamine, and adipoyl chloride.

In some instances, it may be desirable to perform an interfacial reaction without providing a stoichiometric flux of reactants within a composite membrane. Therefore, in some embodiments, reactions that do not require a stoichiometric mixture of reactants to form the desired interfacial reaction may be used. For example, a phase including monomers, soluble polymers, and/or soluble molecules may be located on one side of an active layer of a composite membrane, and an agent that causes polymerization or precipitation of the monomers, soluble polymers, and/or soluble molecules may be located on the other side of the composite membrane. Depending on the embodiment, the molecules may precipitate or polymerize due to pH, the presence of a solvent, the presence of catalysts, the presence of polymer chain growth initiator, or any other appropriate type of agent. In one specific embodiment, Poly(lactic acid) (PLA) is soluble in acetonitrile but not in water. Therefore, introducing PLA in acetonitrile on one side and water on the other side of a composite membrane will cause PLA to precipitate inside the composite membrane. In yet another example, the formation of polyaniline in the presence of an oxidant [O] is as follows: n $C_6H_5NH_2+[O] \rightarrow [C_6H_4NH]_n + H_2O$. Consequently, an oxidant such as ammonium persulfate may be introduced on one side of a composite membrane and the monomer may be introduced on the other. In yet another example, polypyrrole may be formed in a composite membrane using the oxidation of pyrrole using ferric chloride in methanol.

Figure 3B:
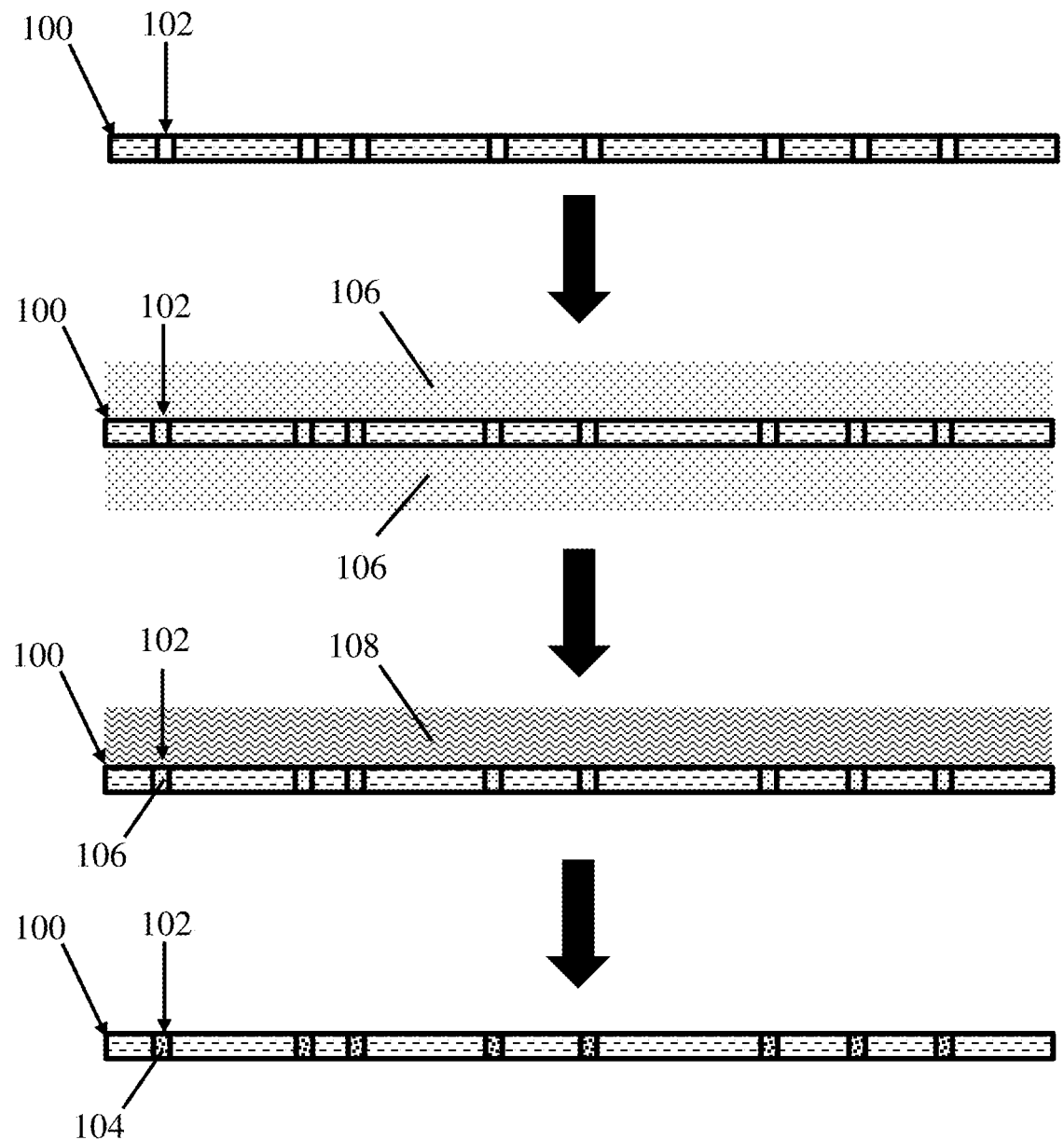
FIG. 3B is a schematic cross-sectional view of sealing a defect in an active layer using an interfacial reaction.

FIG. 3B depicts another embodiment of using an interfacial reaction to seal an active layer 100 including a plurality of defects 102. In the depicted embodiment, the active layer 100 is sequentially exposed to a first phase 106 and a second phase 108. For example, as depicted in the figure, the active layer 100 may be dipped into the first phase 106 such that the first phase 106 is wicked into the defects. However, in some embodiments, the first phase 106 may simply adhere to the surface of the active layer 100 at the locations corresponding to the plurality of defects 102. Regardless of how the first phase 106 is held on the active layer 100, when a side of the active layer 100 is exposed to the second phase 108, the two phases react to form plugs 104 at the plurality of defects. While a particular arrangement for serially exposing the active layer to the separate phases has been depicted in the figures and described above, it should be understood that other arrangements for serially exposing the active layer are also possible.

Depending on the particular embodiment, the two reactive phases might be in the same state of matter, or different states of matter as the current disclosure is not so limited. For example, both the first phase and the second phase might be liquid. In another embodiment, one of the phases might be in a liquid state and/or a liquid phase that contains a reactant which reacts with a gas to produce the desired material. In such an embodiment, the liquid phase may be provided on one side of the active layer using any appropriate method such that it forms a plug when it comes in contact with the gaseous second phase at the open pores and defects of the active layer. Since graphene, is known to be impermeable to most gases in its defect-free state, this method should be relatively easy to implement as long as the pressure difference across the membranes is adequately controlled. In yet another embodiment, both the first phase and the second phase are gaseous phases.

The concept of performing an interfacial reaction to plug a plurality of defects in an active layer can be implemented using any number of different types of reactions including, but not limited to, precipitation reactions and interfacial polymerization reactions. Additionally, these reactions might be performed using two immiscible phases which may be enable the formation of highly stable and reproducible interfaces. For example, an interfacial polymerization reaction using two immiscible phases may be used to produce a highly stable polymer layer that is several nanometers thick to seal the defects and reduce or eliminate reducing or eliminate species transport across the defects where the material is deposited. Additionally, depending on the particular interfacial reaction, material may be deposited to reduce the flow through an associated defect on the size scale of about 1 nm to several micrometers or more. While there are benefits to using two immiscible phases, embodiments in which an interfacial reaction is produced using two miscible phases are also contemplated.

While interfacial reactions may be performed using immiscible fluids, it should be understood that an interfacial reaction may also be performed using miscible fluids, or even the same fluids. These fluids may be introduced on either side of a composite membrane including an active layer, and in some embodiments a support membrane, that hinders mixing of the two fluids so that the stoichiometric fluxes of the reactants occur within the composite membrane. For example, if the graphene, or other active layer, on a support membrane has few defects, introducing monomers in miscible fluids on either side of the composite membrane will lead to polymerization provided the fluxes yield the correct stoichiometry within the composite membrane.

In one embodiment, it may be desirable for an interfacial reaction to seal defects and/or pores that have been formed in a substrate above a predetermined size. For example, processes for creation of selective pores in graphene typically result in pores with a distribution of sizes. If the size distribution is wide enough, or there are other larger defects present within a substrate, it may result in poor selectivity. In some embodiments, the diameter of the larger pores and/or defects may be effectively decreased, or in some instances may be blocked entirely, by using molecules that are able to react, or "lock", across a defect in the ultrathin cross section of a graphene or other atomically thin substrate.

Figure 4A:
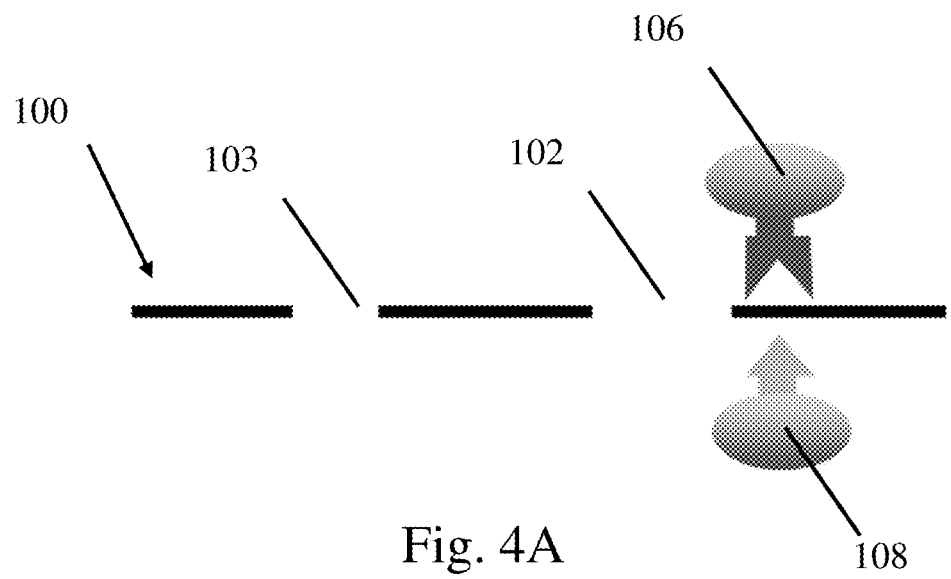
FIGS. 4A-4B are a schematic representation of an interfacial reaction selectively sealing defects greater than a predetermined size.
Figure 4B:
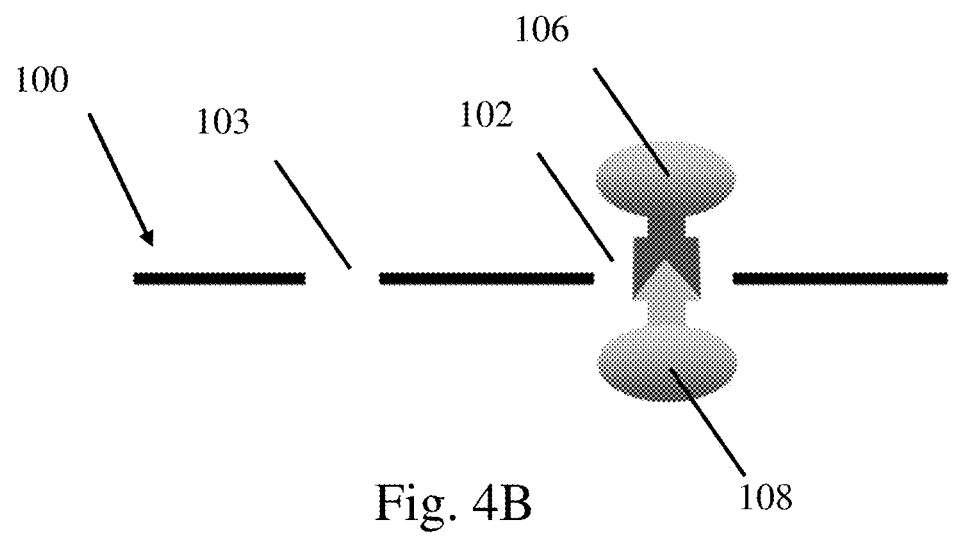

In the embodiment depicted in FIGS. 4A-4B, first and second phases 106 and 108 located on either side of a graphene substrate 100 correspond to two separate molecules. The graphene sheet includes a first defect 102 above a preselected size and a second defect, or formed selective pore, 103 with a size that is less than the preselected size. In the depicted embodiment, the two molecules include one end that is too large to pass through the defects and selective pores in the graphene substrate. However, the molecules also include smaller ends that bind or react with each other and are able to pass through the larger defects 102 but not through the smaller pores 103 in the graphene substrate. Therefore, the molecules are able to react and lock across defects having sizes greater than a size of the two reacting ends, such as defect 102, and are unable to react across defects having sizes less than the size of the two reacting ends, such as selective pore 103. The result is that the interfacial reaction using these molecules blocks, or reduces the effective diameter, of pores or defects greater than a predetermined size while leaving pore or defects smaller than that size alone. In some cases, the small ends of the molecules may have a size ranging from about 0.3 nm to 10 nm, 0.3 nm to 5 nm, 0.3 nm to 1 nm, or any other appropriate size. Additionally, the large ends of the molecules may have a size such that it is larger than, and in some embodiments the same size as, the small end of the molecule and ranges from about 0.3 nm to 20 nm, 1 nm to 20 nm, 5 nm to 20 nm, 10 nm to 20 nm, 1 nm to 10 nm, or any other appropriate size.

The above embodiment using reactants capable of "locking" across an atomically thin substrate may include any number of appropriate material systems. For example, the molecules may include a branched PEG (polyethyleneglycol) molecules, one with an alkyl amine terminal and the other with an acyl chloride terminal, e.g. $(H(OCH_2CH_2)x)_3-C-(CH_2CH_2)y-NH_2$ and $(H(OCH_2CH_2)x)_3-C-(CH_2CH_2)y-COCl$. In another embodiment, a PEG with one end conjugated to a large molecule such as a dextran and the other end terminated with biotin, and introducing neutravidin on the other side of the reaction interface might be used. In yet another embodiment, $(C_2H_5)_3-(CH_2)n-NH_2$ and $(C_2H_5)_3-(CH_2)n-COCl$, where n is >2 and can penetrate across the pores are used. It should be understood that while particular reactants are listed above, the specific reactants as well as the sizes of the larger and smaller ends of the molecules may be selected for any appropriate use and for any appropriate size of defects as the current disclosure is not so limited.

Without wishing to be bound by theory, there are several advantages to using interfacial polymerization as a method to seal graphene composite membranes. Many polymerization reactions happen at room temperature without requiring heat or light, making their implementation easy, although reactions that require heat or irradiation could also be used. Second, polymerization reactions can be implemented in a flow through system and do not require any special equipment. Hence, they are ideally suited for large area membranes.

Since an interfacial reaction depends on the formation of a stable interface and the transport of reactants through the active layer, it is believed that that the process may be implemented to only selectively seal a first plurality of tears, holes, and other defects that are larger than a desired size while leaving a second plurality of smaller tears, holes, and other defects unsealed. Without wishing to be bound by theory, this might be accomplished by choosing an interfacial reaction including reactants larger than a particular size such that the reactants can only pass through, and thus seal, pores and defects that are larger than the reactants while leaving smaller pores and defects unsealed. Thus, the size of holes and defects that are sealed by an interfacial reaction may be controlled by choosing reactants of a certain size. For example, different polymers with different length polymer chains might be used to seal defects with different minimum sizes. However non-polymer reactants of a desired size might also be used. Due to the ability to only seal defects greater than a particular size, interfacial reactions may be used during manufacture and/or usage of a membrane to seal defects larger than a size corresponding to the particular reactants being used.

In some embodiments, it may be desirable to modify the properties of materials deposited using an interfacial reaction. For example, a polymer may be formed with a range of functional groups and properties. In one embodiment, sulfhydryl groups may be incorporated into a polymer to facilitate grafting of additional polymers terminated with maleimide groups in order to densify the polymer. In another embodiment, charged groups such as carboxyl acid may be included in a polymer to confer charge for modulating ionic transport. Other types of functionalization may also be used as the disclosure is not limited in this manner.

Depending on the embodiment, the interfacial reaction may only seal defects that are larger than about 0.5 nm, 1 nm, 2 nm, 3 nm, 5 nm, or 10 nm. For example, the interfacial reaction may be used to seal a membrane while leaving sub-nanometer filtration holes intact. This may be beneficial since most nanofiltration and reverse osmosis processes require holes that are in the sub-nanometer to several nanometer size scale and the above-noted interfacial reactions may be used to seal the nonselective defects while leaving the desired selective pores unsealed.

Several examples of interfacial reactions include, but are not limited to:

(a) an aqueous diamine (e.g. m-Phenylenediamine [MPDA] or Hexamethylenediamine [HMDA]) and (b) an organic solution of an acyl chloride (e.g. trimesoyl chloride [TMC] or adipoyl chloride [APC]) yielding a polyamide at the interface;

(a) aqueous sodium sulfate and (b) aqueous calcium chloride yielding calcium sulfate at the interface;

(a) aqueous sodium carbonate and (b) aqueous calcium chloride yielding calcium carbonate at the interface;

(a) aqueous sodium carbonate and (b) aqueous zinc chloride yielding zinc carbonate at the interface;

(a) aqueous hydrochloric acid with ammonium persulfate and (b) aniline in chloroform yielding polyaniline at the interface;

(a) pyrrole in toluene and (b) aqueous ammonium persulfate yielding polypyrrole at the interface; and (a) poly(lactic acid) in acetone, acetonitrile, or dichloromethane and (b) water form poly(lactic acid) precipitate.

Figure 5:
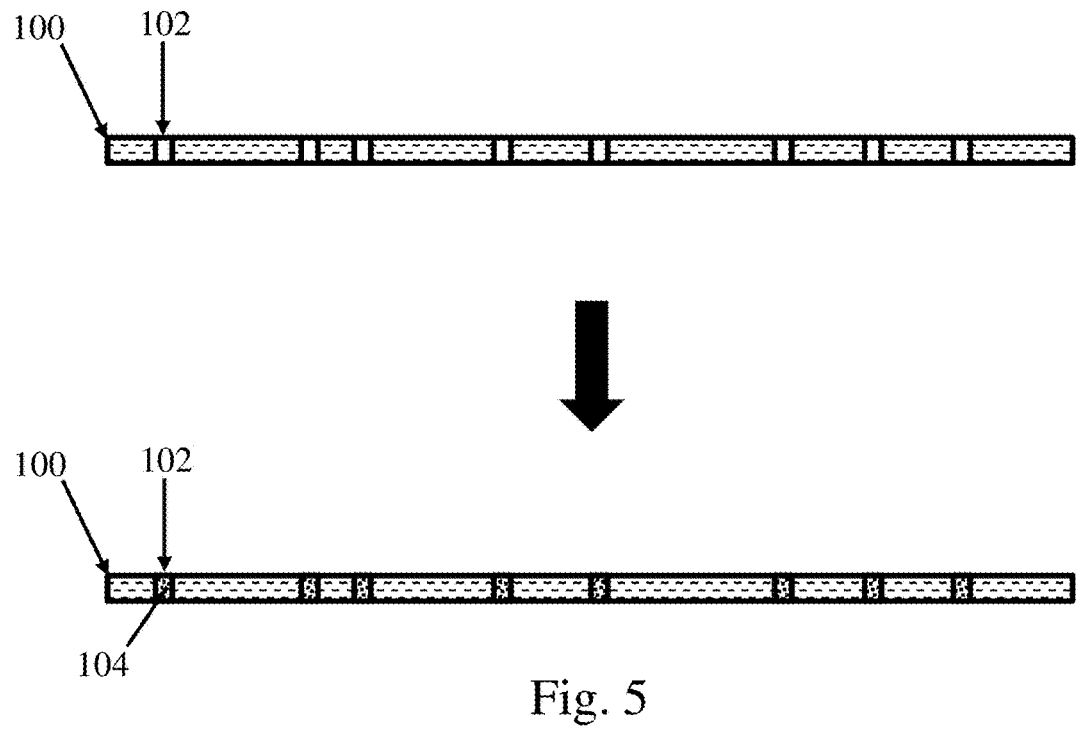
FIG. 5 is a schematic cross-sectional view of sealed defects in an active layer using atomic layer deposition.

FIG. 5 depicts another method for sealing a plurality of defects 102 in an active layer 100. In this particular embodiment, atomic layer deposition (ALD) is used to deposit material onto the active layer 100 to form the plugs 104. Typically ALD is a process in which alternating cycles of adsorption of two different precursors is used to deposit a thin oxide, or other material, one atomically thin layer at a time. Additionally, the inventors have recognized that ALD deposited material preferentially forms at defects in an active layer. Without wishing to be bound by theory, the reason ALD material is preferentially formed at the defect sites is because the ALD precursors are more easily adsorbed on defect sites as compared to pristine graphene that lacks polar groups. Without wishing to be bound by theory, ALD precursors are believed to be more easily adsorbed at defect sites because unsaturated carbon bonds are known to preferentially adsorb $O_2$, $H_2O$, and hydrocarbon contamination due to the defects having higher reactivity (surface energy) than the rest of the lattice. Therefore, similar to interfacial reactions, ALD can be used to seal defects such as holes and tears in an active layer while leaving significant areas of the active layer free from the deposited material. Again leaving the majority of the active layer free from the deposited material allows the creation of selective pores in the atomically thin material of the active layer. While ALD is described above, other processes similar to ALD may be used. For example, any chemical vapor deposition process capable of depositing a controlled thickness of material and selectively depositing that material at the defects as compared to the entire surface of an active layer could be used to selectively seal the defects in the active layer.

ALD deposited layers may have any desired thickness. Additionally, due to ALD depositing atomically thin layers of material during a single deposition cycle, the thickness of the deposited material can be easily controlled by controlling the growth process. Appropriate parameters for controlling the growth of the ALD deposited layers include, but are not limited to, temperature, pressure, duration of exposure, and number of cycles. It should be understood that any appropriate combination of parameters might be used. However in one embodiment, the number of ALD cycles may be between or equal to 5 cycles 30 cycles, 10 cycles and 20 cycles, or any other appropriate number cycles. Further, the deposited material may have a thickness between about 5 nm and 30 nm, 5 nm and 20 nm, or 10 nm and 20 nm, or any other appropriate thickness.

Several nonlimiting examples of appropriate ALD reactions include, but are not limited to:

Alumina using Trimethylaluminum (TMA) and water;
Ruthenium oxide using Ru(od)3 and oxygen;
Zinc oxide using diethylzinc (DEZ) and water;
Titania using $Ti[OCH(CH_3)_2]_4$ and water;
Zirconia using $Zr[OCH(CH_3)_2]_4$ and water;
Titania using $TiCl_4$ and water;
Zirconia using $ZrCl_4$ and water; and
Hafnia using $HfCl_4$ and water.

Figure 6:
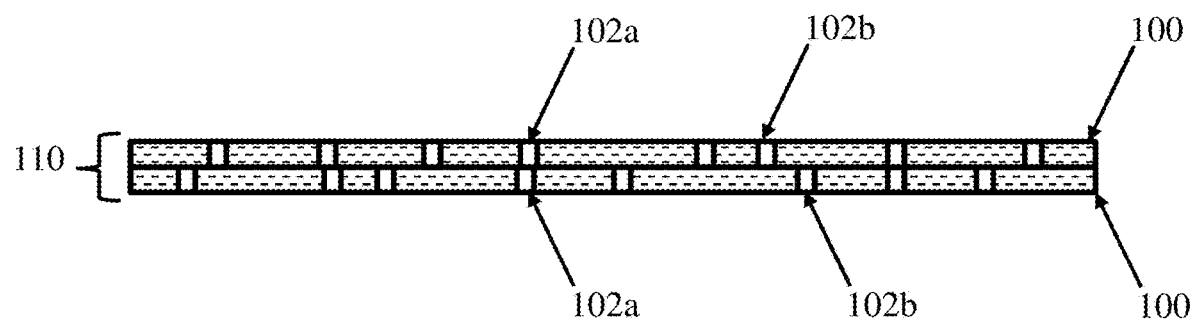
FIG. 6 is a schematic cross-sectional view of an active layer including multiple layers.

The embodiments described above were directed to sealing membrane active layers that included a single layer. However, the current disclosure is not limited to sealing defects in a single layer. Instead, the disclosed methods are capable of use on a membrane active layer including any number of layers. For example, FIG. 6 depicts an active layer 110 that includes two individual active layers 100. These individual active layers 100 include a plurality of defects. In some instances, the defects are aligned with one another as depicted by defects 102a, and in other cases, the defects are unaligned with one another as depicted be defects 102b. The aligned defects 102a permit material to pass through a membrane without selectivity. In contrast, the unaligned defects 102b are blocked from permitting material to pass through the membrane by the adjacent pristine active layer 100. One embodiment in which multiple individual active layers 100 might be included to form an overall active layer 110 is when the active layer is applied to a supporting substrate. More specifically, providing a plurality of active layers may advantageously increase the covered area of the substrate because when a plurality of active layers of the same size and shape are placed on a substrate each will be randomly misaligned. However, it is highly improbable that any would be misaligned in exactly the same way. Therefore, some of the area of the substrate left uncovered by one active layer would likely be covered by subsequently placed active layers. Consequently, the uncovered area of the substrate may be reduced when a plurality of active layers are used. Other applications of multiple active layers are also possible. Additionally, while the individual active layers 100 have been depicted as being in direct contact, in some embodiments, intermediate layers may be positioned between these adjacent active layers. Appropriate intermediate layers include: chemical cross-linkers with reactive terminal groups such as diazonium; different polymers such as poly(dimethylsiloxane), polycarbonate, and polyamide; layers of atomic layer deposited material such as alumina and hafnia; and other appropriate materials.

FIGS. 7-10 depict embodiments of an active layer 100 including a plurality of defects 102 disposed on a porous substrate 112. The porous substrate includes a plurality of pores 114. As depicted in the figures, the pores 114 are aligned pores similar to a track-etched membrane. However, porous substrates including unaligned random pore networks are also possible. For example, graphene based filtration membranes, and other similar membranes, may be combined with a variety of supporting substrates including, but not limited to, porous ceramics, porous metals, polymer weaves, nanofiltration membranes, reverse osmosis membranes, ultrafiltration membranes, brackish water filtration membranes, or any other appropriate substrate.

Depending on the particular embodiment, the porous substrate disposed beneath the active layer may provide structural support to the membrane and may also impede flow through defects present in the one or more graphene layers that are not occluded, or otherwise mitigated. The porous support may provide sufficient resistance to flow through areas where large imperfections in the graphene exist, such that flow through the intended pores may still dominate the overall flow through the composite membrane. For example, the porous support may be a polycarbonate track-etched membrane with pore diameters in the range of 5 nm to 10 µm, and pore lengths (i.e. support layer thickness) in the range of 1 µm to 5 mm (FIG. 3A). Alternatively, the porous support might be a ceramic support with pores in the size range of 10 nm to 10 µm, and a thickness in the range of 100 µm to 10 mm. Furthermore, the support structure itself may include multiple layers. For example, the polycarbonate layer may rest on a sintered steel porous support. Furthermore, it should be understood that the graphene may be disposed on any other appropriate membrane or substrate. For example, asymmetric polyamide membranes used for reverse osmosis of brackish water or seawater might be used. In such an embodiment, the pore sizes of the membrane may be less than 10 nanometers or less than 1 nanometer.

Figure 7:
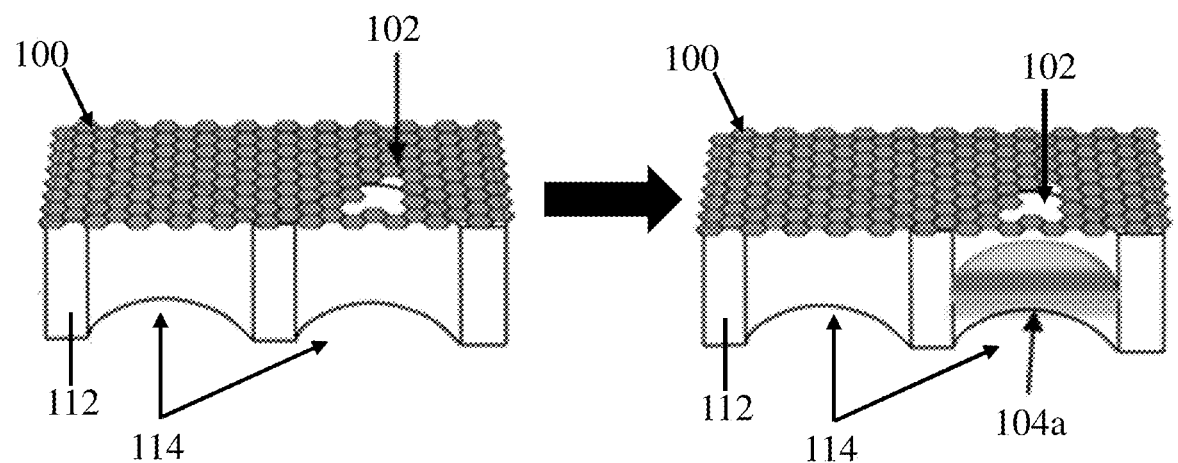
FIG. 7 is a schematic perspective cross-sectional view of sealing a defect in an active layer disposed on a substrate.
Figure 8:
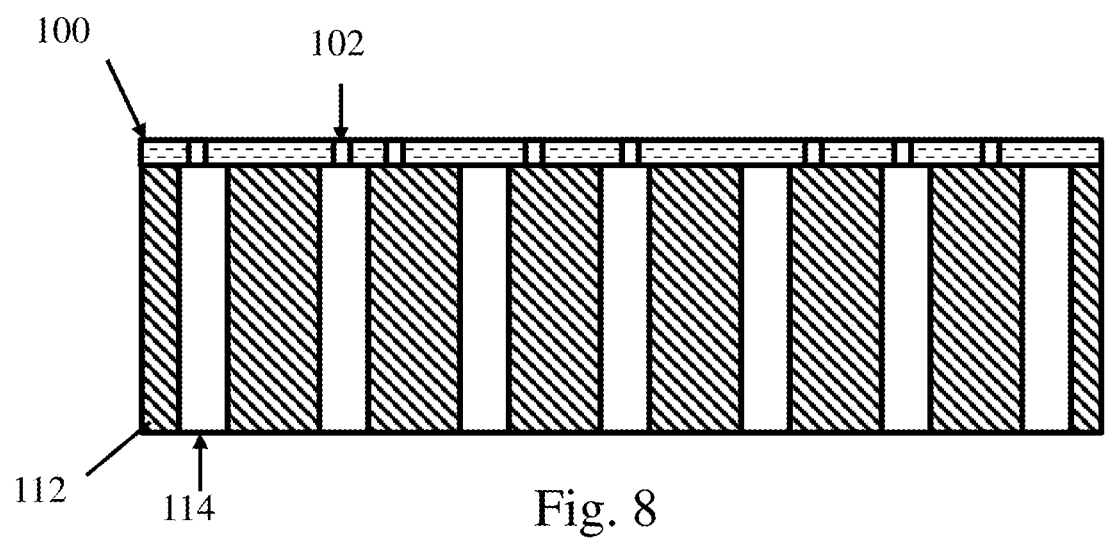
FIG. 8 is a schematic cross-sectional view of a membrane including an active layer disposed on a substrate.
Figure 9A:
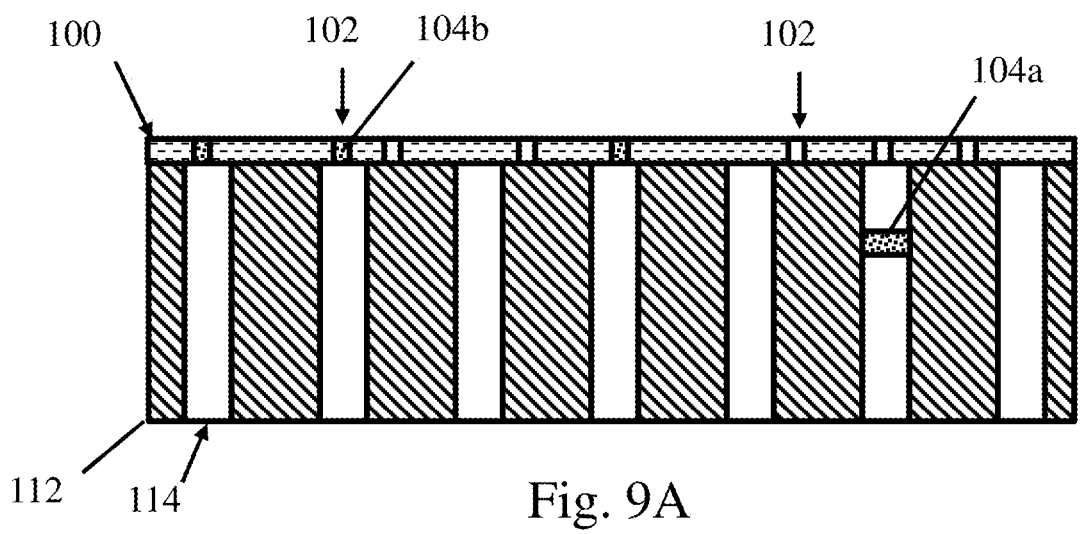
FIG. 9A is a schematic cross-sectional view of the membrane of FIG. 8 after sealing the defects using an interfacial reaction.

FIGS. 7, and 9A illustrate the application of an interfacial reaction to seal a plurality of defects 102 in an active layer 100 disposed on a substrate 112. As illustrated in the figures, depending on where the interface between the two reacting phases was located the defect 102 may either be sealed by plugs 104b located in, or on, the defects themselves, or the defects 102 may be sealed by a plug 104b corresponding to material deposited in a pore 114 of the substrate 112 that is associated with the defect. As noted above, the location of the interface may be controlled in any number of ways. Therefore, it may be possible to selectively form plugs in the active layer 100 itself and/or in the associated pores 114 of the porous substrate.

Figure 9B:
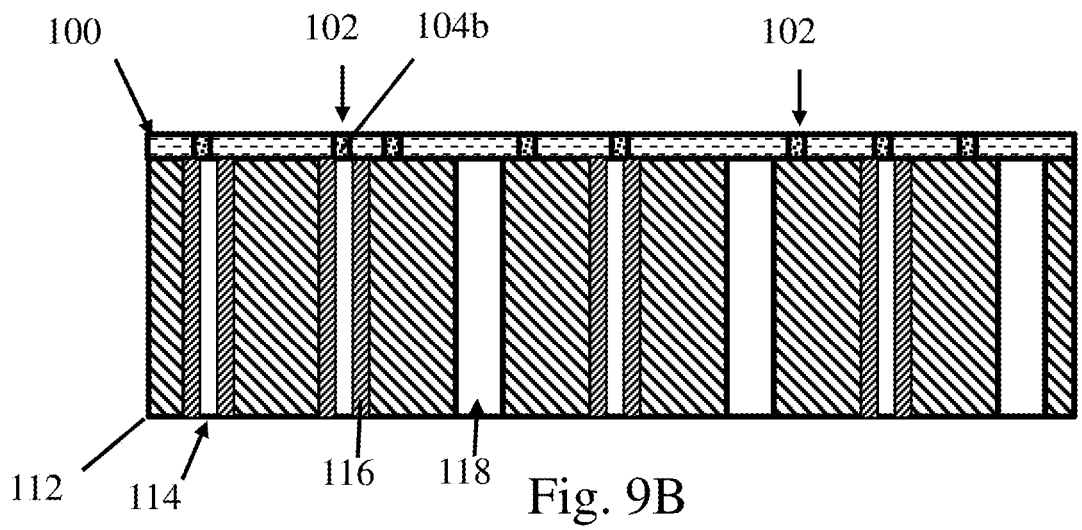
FIG. 9B is a schematic cross-sectional view of the membrane of FIG. 8 after sealing the defects using atomic layer deposition.

FIG. 9B illustrates the application of ALD to seal a plurality of defects 102 in an active layer 100 disposed on a substrate 112. When using ALD to deposit material, material 116 will be deposited both at the defects 102 in the active layer as well as the walls of the pores 114 in the substrate. Different forms of defect sealing may occur using ALD depending on the size of the pores in the substrate as compared to the size of the defects in the active player as well as the speed of growth of the ALD deposited material in the defects and porous substrate. For example, the defects 100 may be sealed by a plug 104b when the defects are sufficiently small or the speed of material deposition at the defects is sufficiently fast as compared to the position of the material in the pores 114. Alternatively, if a supporting substrate's pores are sufficiently small and/or the rate of deposition of material on the substrate is sufficiently fast, then material 116 deposited in the pores 114 may either completely seal or restrict flow through the defects 102. In both embodiments it is desirable that that ALD growth in the defects and/or the pores of the supporting substrate be sufficiently fast compared to lateral growth of ALD deposition on the active layer away from defect sites. Consequently, the majority of the active layer area may remain exposed following treatment using ALD.

One possible way in which to use ALD to seal the defects by depositing material in the pores of the substrate includes protecting the backside of the composite membrane from ALD and performing ALD on the exposed active layer side. As illustrated in the figure, material 116 is deposited in the exposed pores of the substrate associated with the defects 102. However, because graphene is impermeable to ALD precursors, the ALD material will not be deposited in the covered pores 118 of the substrate. As noted above, depending on the ALD layer thickness, the deposited material 116 can either completely seal or significantly restrict flow through the micrometer-scale tears in the composite graphene membrane. Other methods of using ALD to seal pores in the substrate associated with defects in the active layer are also possible.

In some embodiments, ALD only covers defects in an active layer and does not substantially form on the defect free pristine areas of the active layer. Without wishing to be bound by theory, ALD deposition is controlled by precursor adsorption. Additionally, precursor adsorption depends on several factors including, but not limited to, precursor type, pressure, temperature, and gases that compete for adsorption. Generally precursor adsorption decreases at higher temperatures. Therefore, adsorption performed at higher temperatures is more likely to specifically target defects as compared to the pristine defect free portions of the substrate. The introduction of gases such as nitrogen that preferentially adsorb to graphene, or another type of active layer, can be used to make ALD deposition more specific to defects by preventing the adsorption of ALD precursors to the defect free portions of the active layer. Therefore, purging with nitrogen, or another appropriate gas such as methane, ethane, propane, benzene vapors, between precursors may increase the specificity of ALD coatings to the defects by competitively desorbing weakly adsorbed precursors on the defect free pristine portions of the active layer. In view of the above, the use of gases capable of adsorbing to the surface of an active layer may enable the use of ALD performed at lower temperatures while only being deposited substantially at the defects of the active layer.

In one embodiment, ALD is performed on a graphene active layer using (Tetrakis)dimethylmino Hafnium and water. The process is performed at 130 to 300° C. with a base pressure of 100-1000 mTorr using nitrogen as a purge gas. In one specific implementation of such an embodiment, 20 cycles of HfOx are performed to precondition the chamber. 20 standard cubic centimeters (sccm) of nitrogen carrier gas are then applied for a 2400 second purge time and a 0.025 second pulse of water is added to the chamber. After 50 seconds, 30 sccm of nitrogen are added to the chamber. After an additional 50 seconds, 20 sccm of nitrogen are added to the chamber over a period of 20 seconds. Thereafter, a 0.3 second pulse of Hf precursor is added to the chamber. After waiting 50 seconds, 30 sccm of nitrogen s are added to the chamber. After another 50 seconds, 20 sccm of nitrogen are introduced to the chamber over 20 seconds. A final 20 second rest is introduced between subsequent cycles. This cycle may be applied for any appropriate number of times including between 10-20, 20-30, 30-40, or any appropriate number of times as the disclosure is not so limited. Additionally, while specific times, temperatures, purge times, and other parameters are described above, ALD processes may be performed using other parameters.

Figure 10:
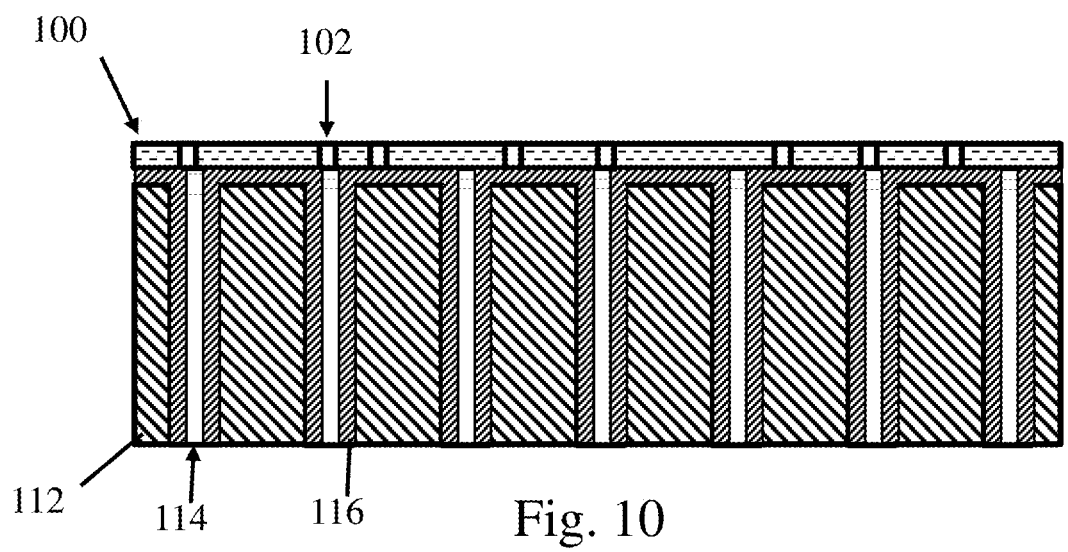
FIG. 10 is a schematic cross-sectional view of a membrane including an active layer disposed on a substrate coated with an atomic layer deposited material.

In addition to sealing defects in an active layer, ALD can also be used to tune the hydrodynamic resistance of a porous substrate. In such an embodiment, an ALD process may be carried out on the porous substrate prior to transferring the active layer in order to reduce the diameter of the pores. During this process, material is deposited onto the surfaces of the pores thereby reducing their diameter and causing a corresponding increase in the flow resistance of the porous substrate. FIG. 10 shows a substrate 112 that includes pores 114 that have had a material 116 applied to them prior to bonding with an active layer 100. Without wishing to be bound by theory, the performance of a composite membrane made from an active layer including nonselective defects may be improved by appropriately matching the porous substrate resistance to the active layer resistance. Due to the ability to precisely control the thickness of material deposited in the pores of the substrate, ALD offers a method capable of precisely tuning the support membrane resistance to achieve a desired matching of the resistance of the porous substrate to the active layer. The feasibility of this approach is demonstrated in more detail in the examples below.

It was observed that the typical hydrophilic coating applied to off-the-shelf membranes to increase water flow rates complicates transfers of centimeter-scale areas of chemical vapor deposited graphene to the substrate. For example, polycarbonate track-etch membranes (PCTEM) are typically coated with hydrophilic polyvinylpyrrolidone (PVP). Without wishing to be bound by theory, these hydrophilic coatings cause a problem during transfer because during transfer the graphene is located on a copper foil and is in contact with the support membrane while the copper is chemically etched away. However, if the support membrane is too hydrophilic, such as when these hydrophilic coatings have been applied, the etchant wicks in between the substrate and the active layer, preventing the graphene from bonding to the support. Consequently, in some embodiments, the surface of a substrate may be coated with a coating that is sufficiently hydrophobic to ensure that the active layer bonds to the underlying substrate without the etchant wicking in between the substrate and the active layer. This coating may be provided in any number of ways. However, in one embodiment, the coating may be applied in a manner similar to that discussed above with regards to FIG. 10. In such an embodiment, ALD may be used to apply an appropriate material 116 to the surface, and optionally to the pores 114, of a substrate 112. After depositing the material, an appropriate transfer technique may be used to bond the active layer 100 to the substrate 112.

It should be understood that the above-noted methods and structures can be used in combination to achieve a membrane with desired characteristics. For example, ALD could be performed on a bare substrate to reduce the diameter of the pores in the substrate, followed by transfer of the active layer onto the substrate. Another ALD step can then be used to seal the various intrinsic and extrinsic defects present in the active layer. Without wishing to be bound by theory, the smaller support pore diameter resulting from the first ALD step might enable the use of a smaller thickness ALD layer in the second step to seal pores in the substrate that are associated with defects. Because the second sealing step uses a smaller amount of ALD deposited material, the amount of lateral ALD growth over the active layer surface may be reduced thus leaving a larger fraction of the membrane area with exposed graphene in which selective pores can be produced. In another embodiment, ALD might be used on a polycarbonate track etched membrane to facilitate subsequent graphene transfer, and then an interfacial reaction may be used to reduce non-selective leakage flow through the composite graphene membrane. In yet other embodiments, defects of different sizes may be sealed using a combination of an interfacial reaction and ALD. For example, ALD may be used to plug multiple small-scale defects and an interfacial reaction could subsequently be applied to plug a smaller number of remaining larger defects.

Depending on the embodiment, pores may be created in the active layer either prior to, or after, bonding the active layer to a substrate. Several options exist for precisely controlling the size of pores created in the active layer. These include, but are not limited to, ion bombardment, chemical etching, gas cluster ion-beam bombardment, pulsed laser deposition, plasma treatment, UV-ozone treatment, and growing graphene on copper with patterned defects. Once the pores are generated, their sizes and shapes can be further refined through chemical etching. Additionally, intrinsic defects or pores in the synthesized graphene can be used for filtration. These pores may occur naturally in chemical vapor deposition (CVD) graphene, or may be introduced during synthesis of graphene by controlling the substrates on which the graphene is grown. For example, the copper substrate for growing CVD graphene may be patterned, alloyed, or coated with nanoparticles to facilitate the introduction of defects of a desired size into the graphene during growth. Additionally, gases such as ammonia or nitrogen may be added during synthesis to create pores during the CVD process. Furthermore, the amorphous regions in graphene may contain a higher number of pores, which can also be used for filtration. Regardless of the manner in which the defects are created, after forming the defects in the one or more active layers, the defects may be selectively etched to a preselected size. Examples of appropriate etchants for these materials include, but are not limited to, concentrated nitric acid, mixtures of potassium permanganate and sulfuric acid, hydrogen plasmas, and hydrogen peroxide.

As compared to the random distribution and alignment of the intrinsic pores, actively created pores may advantageously provide pores through, a single active layer, or multiple stacked active layers, in which the pores pass from one side of the active layer(s) to the other. Further, when these pores are created in a stack of active layers, the pores in each active layer may be substantially aligned with one another. However, regardless of how the pores are generated, or whether the pores are present in a single active layer, or in a stack of active layers, the sizes and shapes of the pores may be controlled to create pore sizes appropriate for filtering molecules or particles of a particular size. This ability to provide pores that pass from one side of the active layer(s) to the other in combination with the methods disclosed above for sealing undesired nonselective defects enables the production of substantially defect free membranes with high selectivity. Additionally, since it is possible to seal these defects in a single atomically thin layer, it may also be possible to realize the benefits associated with filters made from these materials without the need to include a large number of multiple layers thus enabling larger fluxes while maintaining a desired selectivity.

In some embodiments, it may be desirable to modify a supporting membrane and/or active layer to enhance a selectivity of the deposition of materials used to seal leaks from defects in the structure. In one such embodiment, an active layer or substrate may be modified to facilitate grafting of polymers or polymerization on the surface. For example, plasma treatment may damage the surface of a polymeric membrane and make the surface reactive, introduce free radicals, or introduce functional groups depending on the type of plasma used and the environment that the membrane is exposed to after plasma treatment. The plasma treatment can also increase adhesion of an active layer to a substrate, which could aid in graphene transfer from copper foil or another surface to the substrate. A surface may also be modified using irradiation by electrons or photons, e.g. UV modification. In some embodiments, the irradiation may be performed selectively on a side of the membrane. Additionally, an active layer and/or substrate may be modified using a variety of functional groups. In one exemplary embodiment, a surface may be modified to bind covalently or non-covalently to graphitic surfaces to facilitate, for example, graphene transfer to a substrate. One possible type of functionalization includes azide functionalization.

In one embodiment, a polysulfone, polyethersulfone ultrafiltration membrane, or other appropriate membrane used as a support substrate for graphene is treated with carbon dioxide plasma followed by surface functionalization with azide groups. Graphene is then transferred onto the surface. Any tears, holes, or defects in the active layer will leave the underlying support substrate with azide groups exposed. The exposed azide functional groups are then used for grafting or growth of polymers (e.g. by using an interfacial polymerization reaction) or using nanomaterials (e.g. graphene nanoflakes, nanoparticles, dextrans) to block leakage to the substrate that is exposed and left uncovered with graphene.

In another embodiment, a polysulfone, polyethersulfone ultrafiltration membrane, or other appropriate membrane used as a support substrate for graphene is treated with argon plasma, followed by transfer of graphene from copper foil. Any defects in the graphene will expose areas of the support membrane that are then modified with polymers, nanomaterials, or other materials. In embodiments where nanomaterials are used, the nanomaterial may be sized such that it is comparable to or larger in size than a pore size of the substrate. In other embodiments where nanomaterials are used, the the nanomaterial may be sized such that it is smaller in size than a pore size of the substrate.

While the exemplary embodiments above have mostly detailed functionalizing the surface of the substrate, embodiments in which the active layer edges and defects present include functional groups that facilitate grafting or growth of a material thereto are also contemplated.

In some embodiments, it may be desirable to increase the selectivity of the pores present in an active layer. Therefore, in such an embodiment, the pores present in the active layer may be functionalized to enhance the selectivity of the composite membrane. For example, the pores might be functionalized such that they are hydrophobic or hydrophilic depending on the desired application. Specific forms of functionalization may include, but are not limited to, carboxyl groups, hydroxyl groups, amine groups, polymer chains (polyamide, polyethyleneglycol, polyamide, etc), small molecules, chelating agents, macrocycles, and biomolecules (e.g. crown ethers, porphyrins, calixarenes, deferasirox, pentetic acid, deferoxamine, DNA, enzymes, antibodies, etc.). In some embodiments, the above noted functionalizations, as well as other appropriate functionalizations, may be used to modulate transport of a molecule or particle through graphene. For example, and without wishing to be bound by theory: 15-crown-5 preferentially binds sodium ions and may thus regulate its transport, or, it may regulate the transport of other ions or molecules in response to binding of a sodium ion; polyethyleneglycol may preferentially allow transport of only small hydrophilic molecules and ions; and polyamide may allow for the preferential transport of water. In alternative embodiments, only the pores may be selectively functionalized. For example, the pores can have different chemical groups depending on the method of pore creation and treatment due to the pores oftentimes being more reactive than the surface of the active layer. These differences can be used to selectively functionalize only the pores. Thus, embodiments in which the surface and/or pores of the graphene are functionalized are possible.

In some embodiments, graphene, or another atomically thin material is located on a substrate which may be modified using an appropriate chemistry such as a silane chemistry. For example, PEG-silanes where PEG is polyethylene glycol and the silane terminal is trichlorosilane, trimethoxysilane, etc. will graft onto the underlying substrate. In case of graphene on gold-coated substrates, the substrates may be modified using thiol chemistry, e.g. PEG-thiols. Several methods are available for modification of polyethersulfone and other polymer substrates by grafting of other polymers, for example as outlined in Bhattacharya and Misra, Progress in Polymer Science 29 (2004) 767-814, or by Deng et al Progress in Polymer Science 34 (2009) 156-193, which are incorporated here in their entirety by reference. Other methods include blending of polymers to create specific functional groups for modification, e.g. covalent modification of polyethersulfone by bovine serum albumin by blending with poly(acrylonitrile-co-acrylic acid) as described by Fang et al Journal of Membrane Science 329 (March 2009), 46-55. Other examples are modification of poly(vinylidene fluoride) (PVDF) using poly(3,4-dihydroxy-1-phenylalanine) as described by Zhu et al Colloids and Surfaces B: Biointerfaces 69, (2009) 152-155. Another example is modification of cellulose substrates by surface initiated atom transfer radical polymerization (ATRP) by growing poly[poly(ethylene glycol) methacrylate] layers as described by Singh et al Journal of Membrane Science 311 (2008) 225-234. Additionally, if reactants used in the above examples are introduced only from the active layer side, surface modification of the substrate will occur only where defects in the active layer permit reactants to cross across the active layer, thereby coating the underlying substrate and decreasing leakage.

In some embodiments, it is desirable to form a compact polymer layer. Therefore, in such an embodiment, especially for grafting less water-soluble polymers, the polymerization may take place in non-aqueous conditions in which the grafted polymer chains are flexible. The polymer will subsequently collapse into a more compact form in the absence of the solvent after the polymerization has occurred.

For commercial applications, increasing the durability of the membrane may be desirable. Therefore, in some embodiments, a protective coating may be applied to the active layer to ensure that the membrane will function effectively after repeated handling and/or use. For example, the protective layer might be used to provide mechanical protection and/or antifouling properties such as anti-scaling or anti-biofouling. Appropriate protective layers include, but are not limited to: polymers deposited by layer-by-layer assembly such as polyethyleneglycol, polyamide, polysulfone, polyanionic and polycationic polymers; zwitterionic molecules; and nanoparticles such as silver and titania nanoparticles.

While many of the embodiments described above have been directed to selectively depositing materials only at the defects in an active layer and/or composite membrane, embodiments in which materials are depositing on the surface of the active layer and/or substrate are also contemplated. For example, a polymer may be covalently grafted, grown, or deposited onto an active layer as well as the underlying exposed substrate so long as it does not completely block flow through selective pores formed in the active layer.

Example: Interfacial Polymerization Sample Preparation

Graphene was grown using a chemical vapor deposition (CVD) process and was subsequently transferred to polycarbonate membranes with 200 nm diameter pores using established protocols. The membranes were suspended at the water/hexane interface in a Franz cell (Permgear). The aqueous phase contained diamine (m-Phenylenediamine [MPDA] or Hexamethylenediamine [HMDA]) at a concentration of 10 mg/mL while the organic phase contained an acyl chloride such as trimesoyl chloride [TMC] or adipoyl chloride [APC] at a concentration of 10 mg/mL. The lower part of the cell was first filled with the aqueous solution, after which the graphene composite membrane was slowly placed at the interface, graphene side down, such that the aqueous phase wetted the graphene side of the membrane. Then the top portion of the cell was carefully placed and clamped in position. The organic phase (hexane) was then slowly added to the top cell (~0.5 mL) to fill it half way and the reaction was allowed to proceed for the desired time (from 3 min up to several hours depending on the conditions). Afterward, the hexane solution was carefully aspirated after which 0.5 mL of pure hexane was added to the top cell to wash away the remaining reactants. This washing process was repeated three times, after which the same washing procedure was repeated with ethanol once (to neutralize the unreacted acyl chloride). Lastly, the top cell was removed and the membrane was washed in a pure ethanol bath. The membrane was then placed in the test chamber or taken for further processing.

Example: Interfacial Reactions

Figure 11:
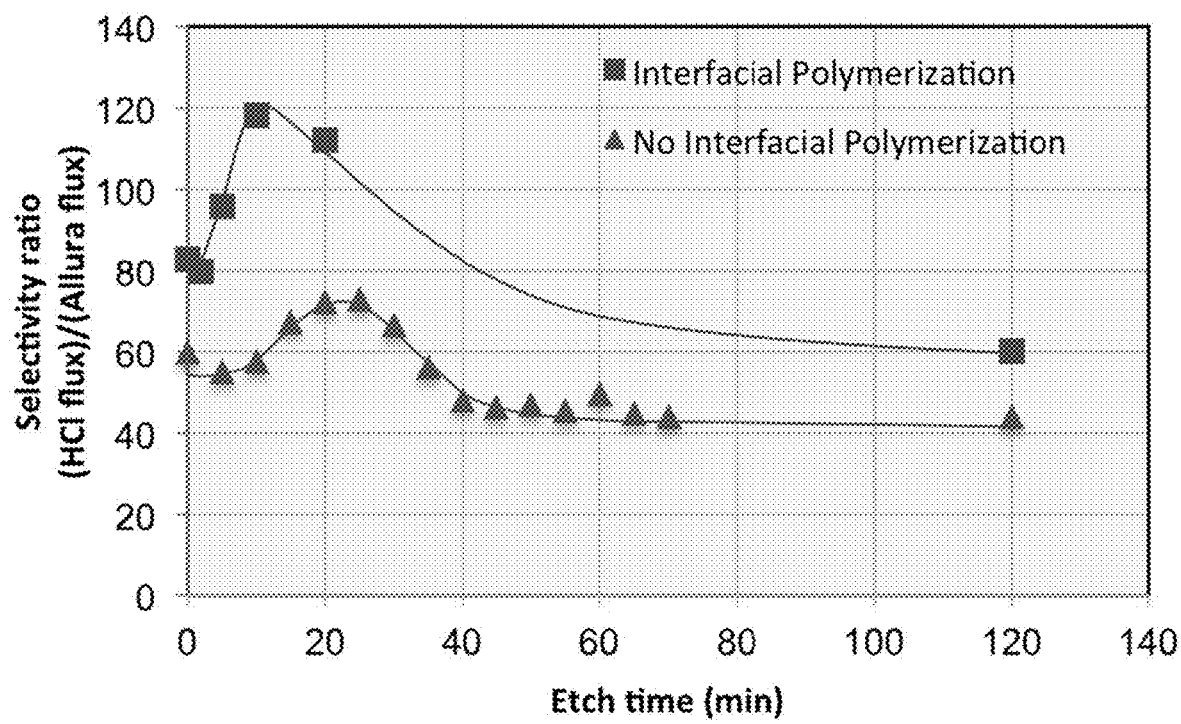
FIG. 11 is a graph of selectivity versus etch time for membranes sealed with interfacial polymerization and unsealed membranes.
Figure 12:
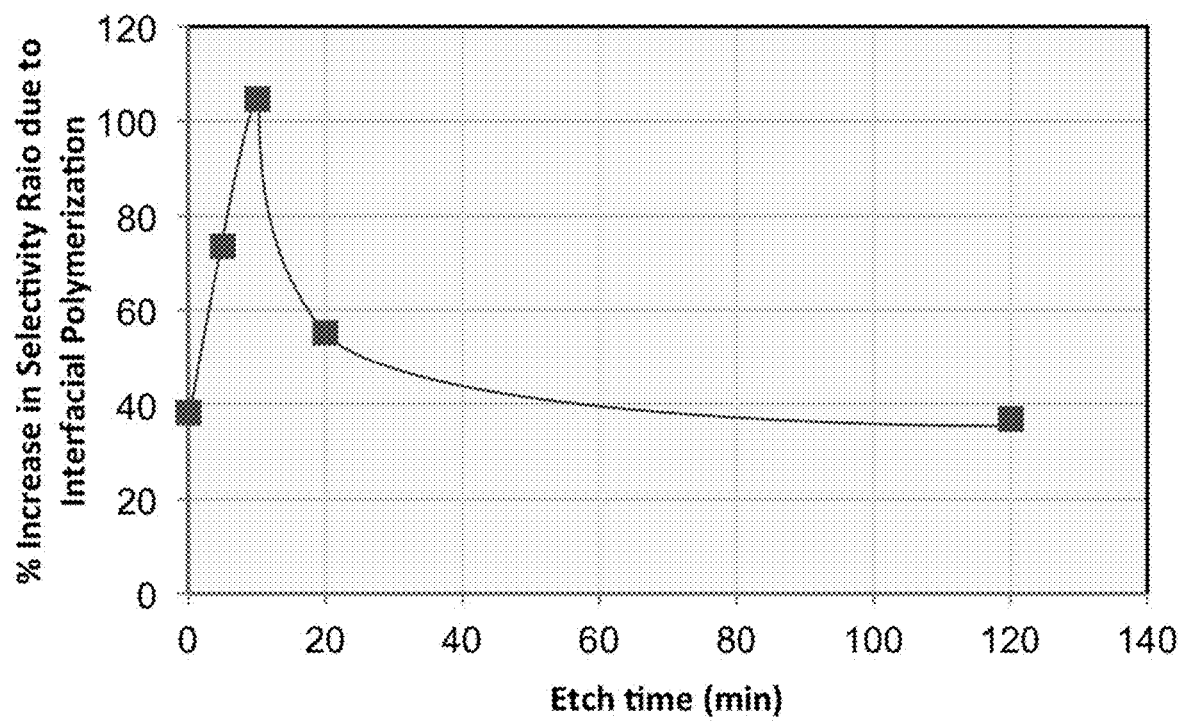
FIG. 12 is a graph of percent increase in selectivity ratio versus etch time for a membrane sealed with interfacial polymerization as compared to unsealed membranes.

In one set of experiments, graphene membranes were sealed using a reaction between APC and HMDA, after which the resulting membranes were processed to create tunable holes on the graphene. In this procedure, membranes comprising a layer of CVD graphene on 200 nm diameter polycarbonate track etched membranes (PCTEM) were bombarded with focused gallium ions to nucleate atomic defect sites and subsequently etched in a potassium permanganate and sulfuric acid solution to gradually grow nanopores with etch time. The membranes were then loaded in diffusion cells and transport of hydrochloric acid and Allura Red was measured using established protocols. As illustrated by FIGS. 11-12, the interfacial polymerization treatment improved the selectivity of the membranes as expected. In fact, a nearly two fold increase in the selectivity of the sealed membrane versus the unsealed membrane was observed at 10 minutes etch time.

Figure 13A:
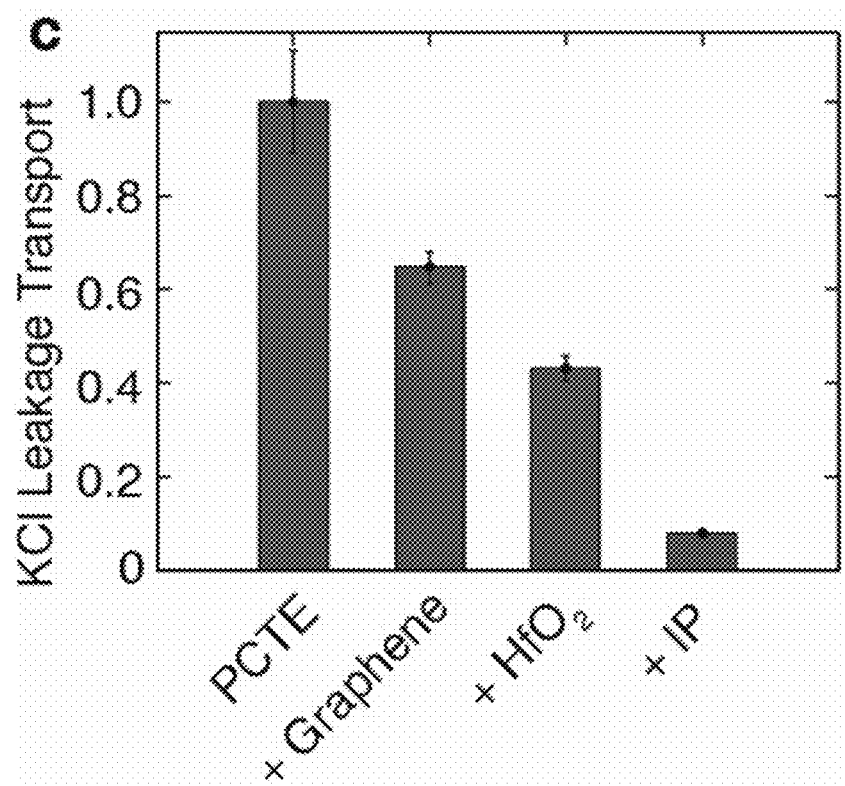
FIG. 13A is a graph of KCl leakage for a bare polycarbonate track-etched (PCTE) membrane substrate, after graphene has been disposed on the substrate, after ALD deposition of $HfO_2$, and after interfacial polymerization.

In one set of experiments, the effect of interfacial polymerization (IP) using the diffusive transport rate of potassium chloride (KCl) normalized by transport rate through a bare PCTE membrane were performed. As shown by FIG. 13A, the transport rate decreases with each successive sealing step of adding graphene to the PCTE, applying $HfO_2$ to the composite membrane using ALD and applying an interfacial reaction of HMDA and APC. The final leakage rate of the composite membrane was 7% that of the untreated PCTE.

Figure 13B:
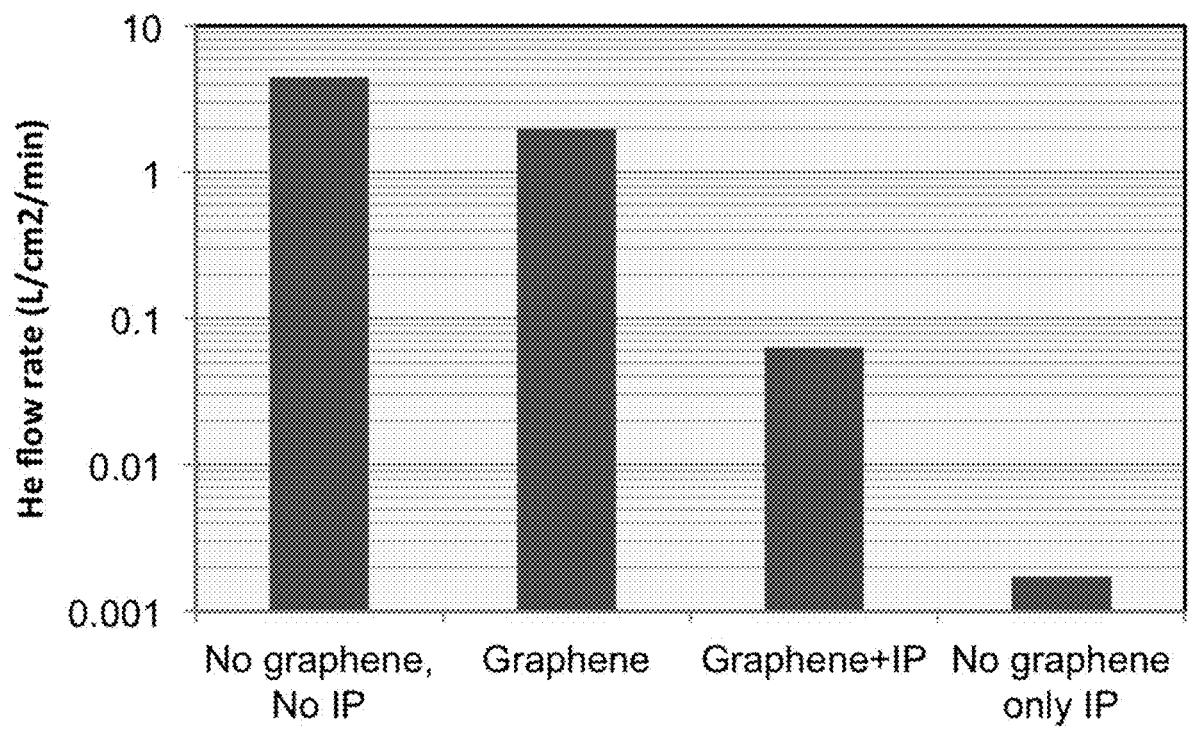
FIG. 13B is a graph of helium flow rate for a bare polycarbonate track-etched membrane substrate, graphene disposed on a substrate, graphene disposed on a substrate and subjected to interfacial polymerization, and a bare substrate subjected to interfacial polymerization.

In a similar set of experiments, the amount of blockage the interfacial polymerization treatment provided was determined by measuring the permeance of the membranes to helium in a gas flow cell, see FIG. 13B. Note that the gas flow rates are normalized by the helium flow rate through a 200 nm pore polycarbonate track-etch membrane (PCTEM) without any graphene or interfacial polymerization. Normalized flow rates for a membrane including untreated graphene disposed on the PCTEM substrate, graphene disposed on the PCTEM substrate and treated with interfacial polymerization, and a PCTEM substrate treated with interfacial polymerization are also depicted. As illustrated by the graph, the interfacial treatment on bare polycarbonate track etched membranes with 200 nm pores resulted in a 99.96% reduction in flow rate, while interfacial treatment on graphene membranes (i.e. one layer of CVD graphene transferred to the same type of polycarbonate membrane) caused a 96.78% reduction in flow as compared to the untreated graphene membrane disposed on the same substrate.

In combination, these results demonstrate the ability of interfacial reactions to effectively reduce the flow of material through defects in graphene membranes.

Example: Atomic Layer Deposition

Figure 14A:
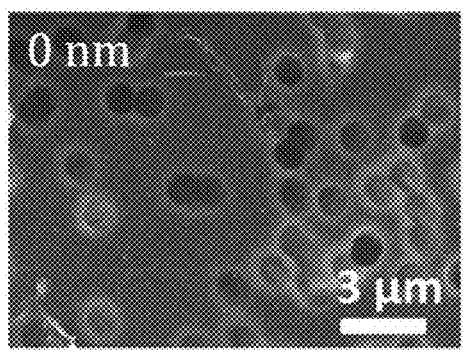
FIG. 14A is an SEM image of graphene disposed on top of an 1 am pore polycarbonate track etched membrane.
Figure 14B:
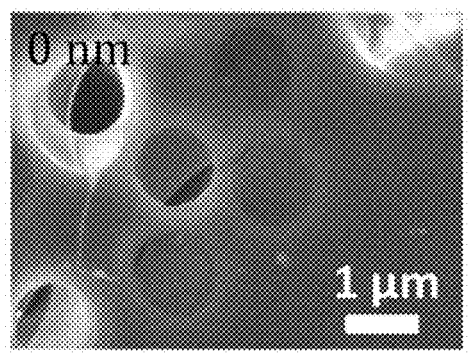
FIG. 14B is an SEM image of graphene disposed on top of an 1 am pore polycarbonate track etched membrane.
Figure 15A:
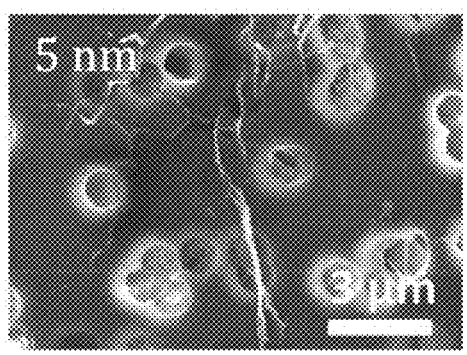
FIG. 15A is an SEM image of 5 nm thick atomic layer deposited aluminum oxide on graphene disposed on top of an 1 am pore polycarbonate track etched membrane
Figure 15B:
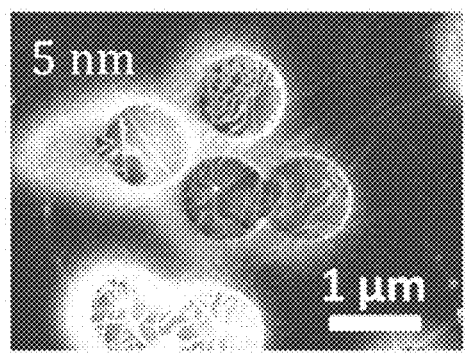
FIG. 15B is an SEM image of 5 nm thick atomic layer deposited aluminum oxide on graphene disposed on top of an 1 am pore polycarbonate track etched membrane.
Figure 16A:
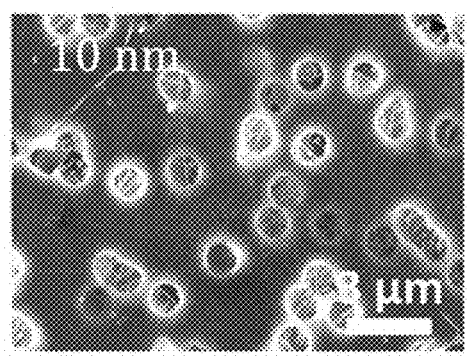
FIG. 16A is an SEM image of 10 nm thick atomic layer deposited aluminum oxide on graphene disposed on top of an 1 am pore polycarbonate track etched membrane.
Figure 16B:
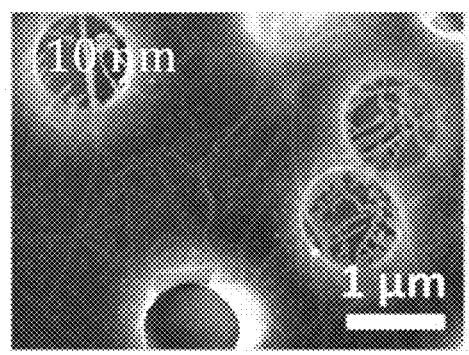
FIG. 16B is an SEM image of 10 nm thick atomic layer deposited aluminum oxide on graphene disposed on top of an 1 am pore polycarbonate track etched membrane.
Figure 17A:
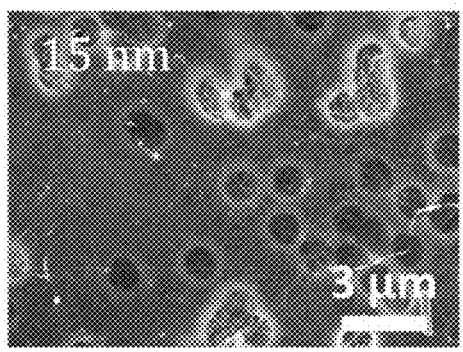
FIG. 17A is an SEM image of 15 nm thick atomic layer deposited aluminum oxide on graphene disposed on top of an 1 am pore polycarbonate track etched membrane.
Figure 17B:
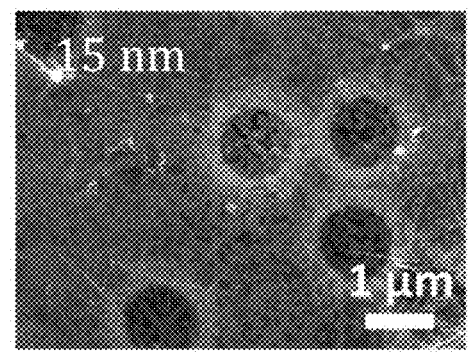
FIG. 17B is an SEM image of 15 nm thick atomic layer deposited aluminum oxide on graphene disposed on top of an 1 am pore polycarbonate track etched membrane.

Without wishing to be bound by theory, the spacing between nanometer-scale intrinsic defects in CVD graphene is larger than the smallest commercially available PCTEM support pore diameter (about 10 nm). Additionally, the lateral growth rate of ALD on graphene away from defect sites has been measured to be several times greater than vertical growth rates. Consequently, scanning electron microscope (SEM) images were used in combination with gas flow measurements to demonstrate that support membrane pore resistance can be significantly increased while leaving large areas of exposed graphene. FIGS. 14A-17B show SEM images of aluminum oxide ALD of various thicknesses ranging from 0 nm to 15 nm deposited on graphene disposed on 1 μm pore PCTEMs. These images were obtained in a JEOL 6320FV Field-Emission High-Resolution SEM at an acceleration voltage of 5 kV and in secondary electron imaging mode. FIGS. 14A and 14B show a membrane before ALD, in which polycarbonate pores (1 μm diameter circles) are visible. Graphene sitting on top of the polycarbonate pores can be distinguished from the darker areas where the graphene is torn. FIGS. 15A-17B show membranes after ALD, with successively higher numbers of ALD cycles. The concentration of the small white lines and spots, which are the deposited aluminum, increase with the number of ALD cycles performed and show how the ALD grows on the graphene composite membranes.

Figure 18:
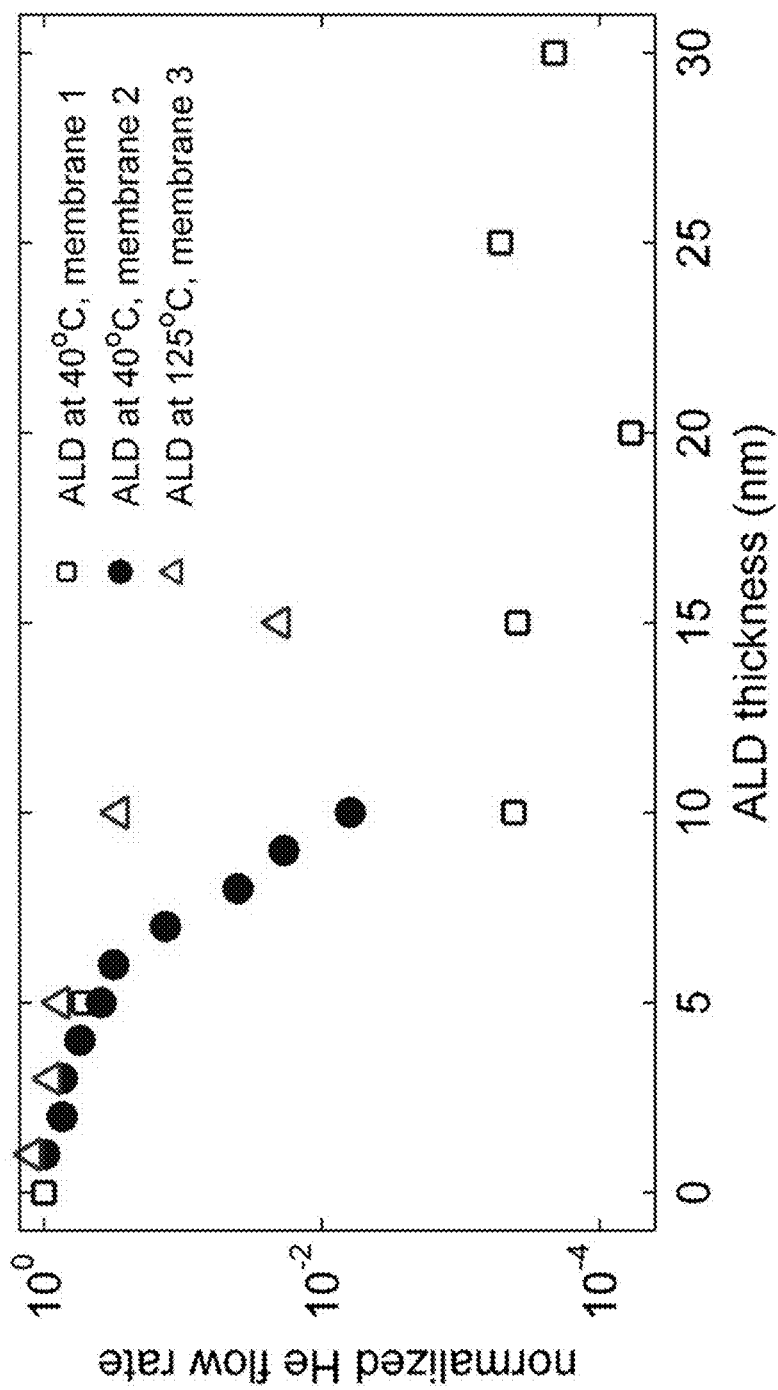
FIG. 18 is a graph of normalized helium flow rate versus thickness of atomic layer deposited aluminum oxide.

As illustrated in the figures, approximately 20% to 70% of the graphene area remains uncovered by the ALD material when the layer thickness is between about 10 nm and 15 nm. The layers were deposited at 125° C. Additionally as shown by the graph in FIG. 18, ALD thicknesses between about 10 nm and 15 nm lead to significant reductions in He gas flow through the membrane. In combination, these images and data show that micrometer-scale tears in a graphene membrane supported over 10 nm polycarbonate pores can be almost completely sealed, while leaving large fractions of the graphene free to create selective nanometer-scale pores.

Figure 20:
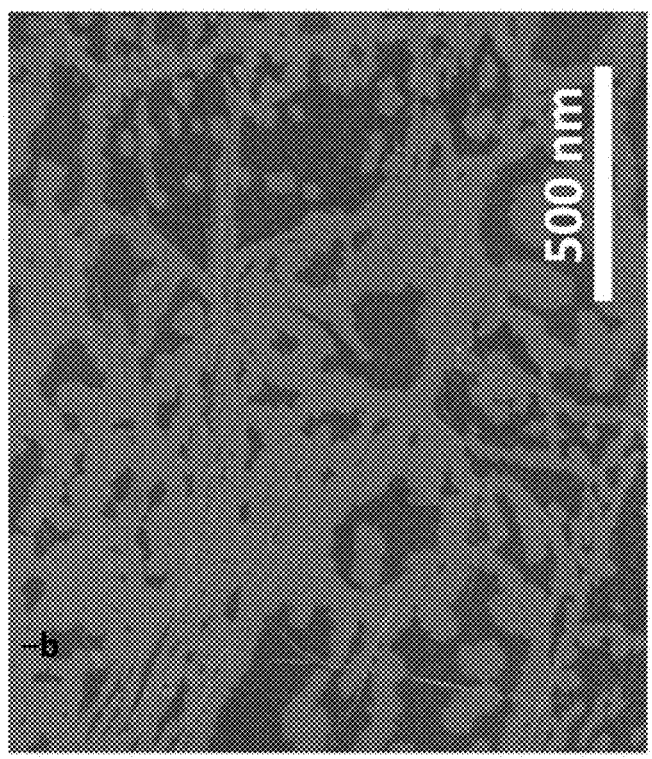
FIG. 20 is an SEM image of 15 nm thick atomic layer deposited aluminum oxide on graphene disposed on top of a 10 nm pore polycarbonate track etched membrane.
Figure 19:
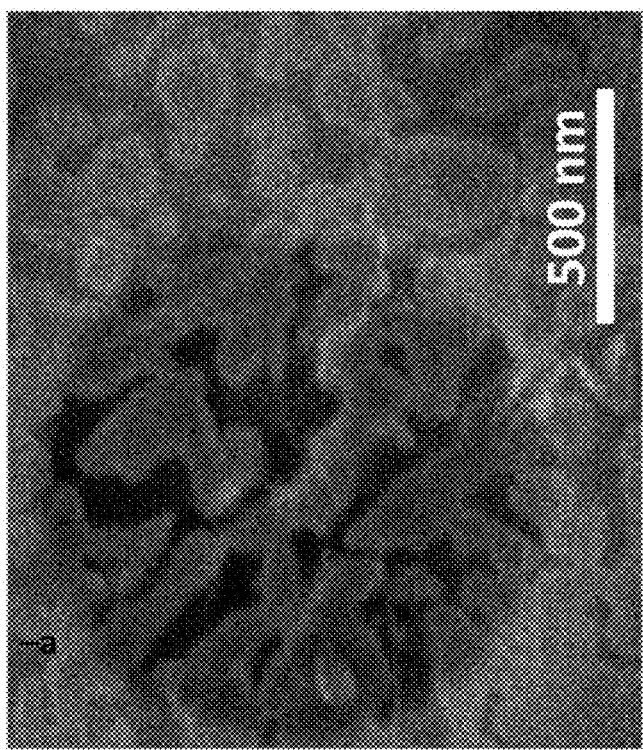
FIG. 19 is an SEM image of 15 nm thick atomic layer deposited aluminum oxide on graphene disposed on top of an 1 am pore polycarbonate track etched membrane.

FIGS. 14A-17B also illustrate that the ALD material does not show a preference as to growing on graphene suspended over the pores as compared to graphene located over the polycarbonate. This suggests that ALD will deposit similarly on membranes with smaller pore diameters. This is further supported by FIGS. 19 and 20 which show SEM images of ALD deposited aluminum oxide on graphene over a 1 μm pore PCTEM and over a 10 nm pore PCTEM. Although the 10 nm pores cannot be resolved, the ALD growth patterns as observed in the SEM images are similar for the two membranes suggesting that the underlying PCTEM pores did not influence the ALD deposition.

Figure 21:
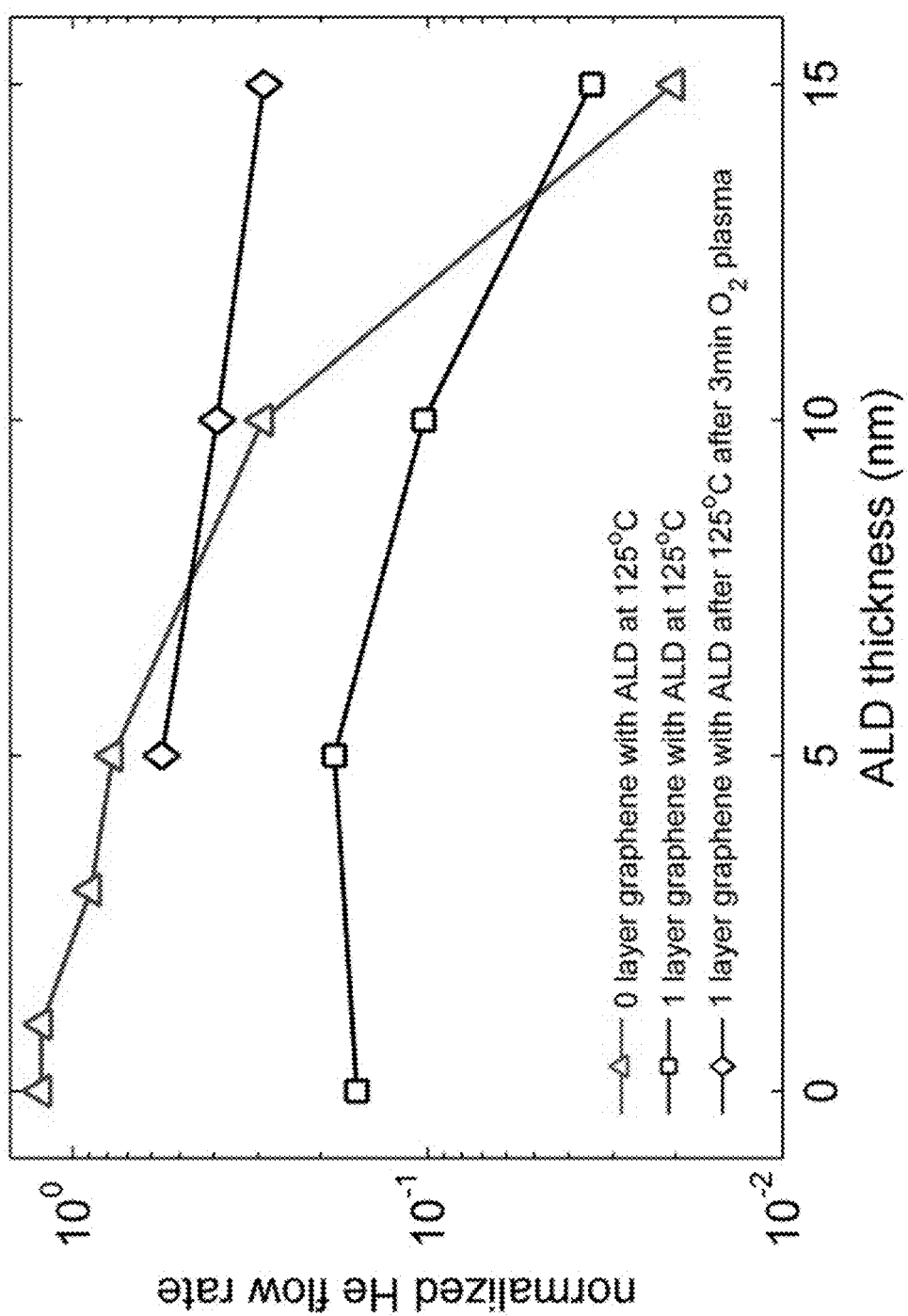
FIG. 21 is a graph of normalized helium flow rate versus thickness of atomic layer deposited aluminum oxide.

The existence of exposed graphene after ALD growth was further confirmed by exposing the membranes to oxygen plasma following ALD and measuring the flow rate. FIG. 21 shows the normalized helium flow rates for a bare 10 nm pore PCTEM as well as a membrane including a single graphene layer disposed on PCTEM and a single graphene layer disposed on PC TM that was subsequently exposed to a three-minute oxygen plasma etch. Normalized flow rates greater than one in PCTEM's are common due to variability in manufacturing. The flow rates for these different membranes are illustrated for a range of different ALD thicknesses. As expected, the flow rates through membranes with one layer of graphene that have undergone ALD are decreased as compared to the flow rate through bare PCTEMs that have undergone ALD, except in the case with 15 nm ALD thickness. Without wishing to be bound by theory, this is believed to be due to an ALD thickness of 15 nm significantly blocking the PCTEM pores. However, a different behavior is observed for the membranes exposed to the oxygen plasma etch. Without wishing the bound by theory, when a graphene layer is disposed on the substrate, some of the PCTEM pores are protected during ALD deposition and material is not deposited there. Therefore, a greater He flow rate would be expected in the membrane after the oxygen plasma etch as compared to the substrate simply exposed to ALD deposition because the previously protected, and consequently unblocked pores with lower flow resistance, are exposed when the overlying graphene is etched away by the oxygen plasma etch. This behavior is confirmed for ALD thicknesses of 10 nm and 15 nm where the He flow rate is greater in the membrane including a graphene layer that has been exposed to the oxygen plasma etch. This suggests that the oxygen plasma has removed the exposed graphene while leaving the ALD that was within the substrate pores. Therefore, and again without wishing to be bound by theory, these results indicate that there was at least a portion of the graphene that was not covered by the ALD material.

Example: Controlling Permeance of the Porous Substrate

FIG. 21 demonstrates the viability of using ALD to control the permeance of the porous substrate. More particularly, at ALD thicknesses between about 10 nm and 15 nm, a significant reduction in the helium flow rate was observed for the bare 10 nm pore PCTEM. As noted previously, the ALD process can be used to reduce the diameter of the pores in the porous substrate thereby reducing the flow through leakage pathways as well as precisely and uniformly increasing the resistance to flow within the membrane. As illustrated by the bare PCTEM data, ALD can be used to increase the resistance of the porous substrate by over one thousand times. Further, the observed gradual reduction in flow rate with ALD thickness confirms that the support membrane resistance can be tuned precisely by controlling the ALD thickness.

Example: Using Atomic Layer Deposition to Modify Graphene Transfer

Figure 22:
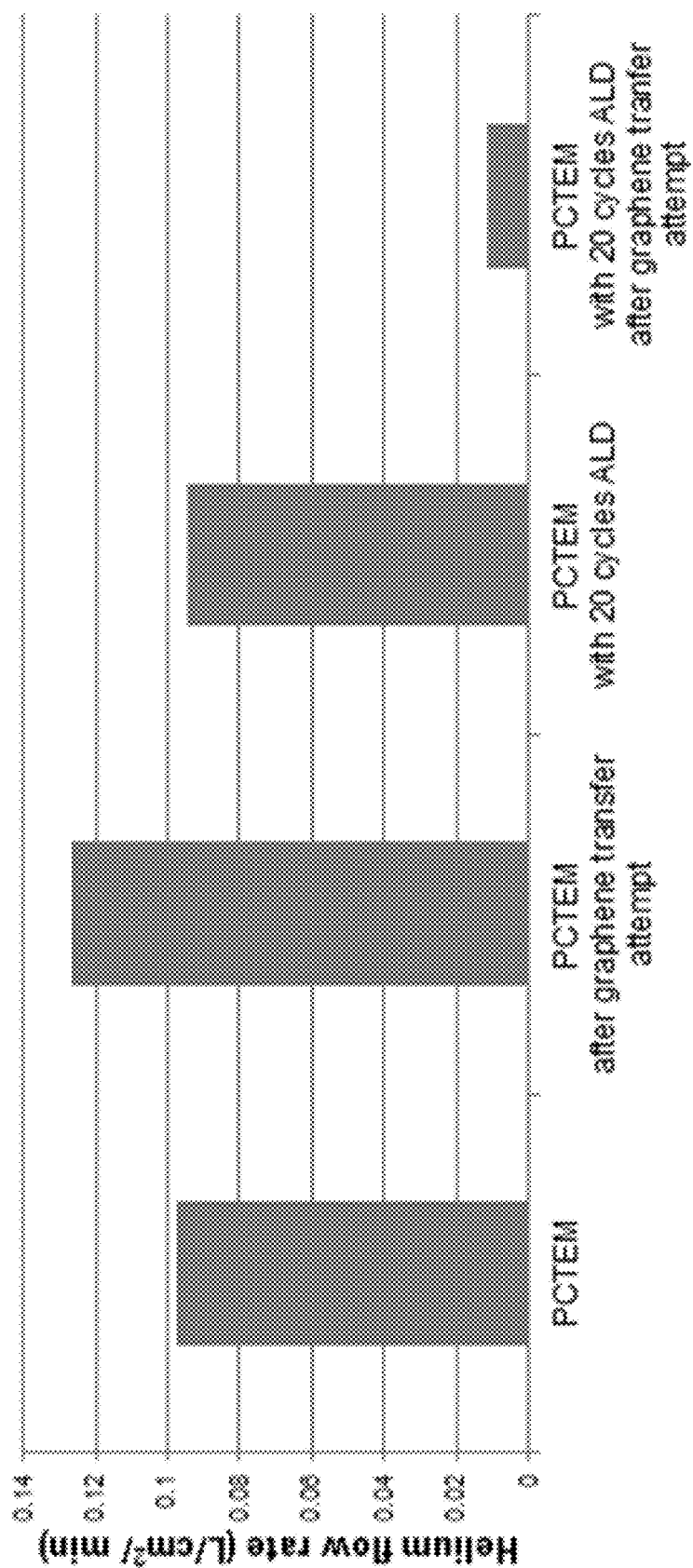
FIG. 22 is a graph of helium flow rate through a 10 nm pore polycarbonate track etched membrane before and after graphene transfer for unmodified substrates and substrates that have been modified with atomic layer deposited hafnium oxide.

FIG. 22 is a graph of the helium flow rate through various membranes and illustrates the effectiveness of using ALD to modify the surface of a substrate in order to achieve improved bonding with a graphene layer during transfer. The tested membranes included: a bare 10 nm pore PCTEM substrate coated with polyvinylpyrrolidone (PVP); a 10 nm pore PCTEM substrate coated with PVP after a graphene transfer attempt; a bare 10 nm pore PCTEM substrate subjected to 20 cycles of hafnium oxide ALD; and a 10 nm pore PCTEM substrate subjected to 20 cycles of hafnium oxide ALD after a graphene transfer attempt. Without ALD, the graphene transfer was unsuccessful and no graphene was visible over the polycarbonate. This is confirmed by the large helium flow rate observed for this sample. However, after 20 cycles of hafnium oxide ALD, a transfer of a 5 mm by 5 mm area of graphene to the substrate was successful as illustrated by the significantly lower helium flow rate through that membrane. The significantly lower flow rate after a graphene transfer attempt on a PCTEM with ALD demonstrates that ALD can be used to facilitate graphene transfers to PVP coated substrates. ALD is expected to offer similar benefits for other coatings that graphene, or other active layers, do not bond readily bond to during typical manufacturing processes. In addition to the above, as illustrated by the comparison between the bare PCTEM sample and the PCTEM sample after 20 cycles of ALD, the small 2 nm ALD thickness has almost no effect on the flow rate through the bare membrane.

Example: Labeled Interfacial Reaction

Figures 23A, 23B, 23C:
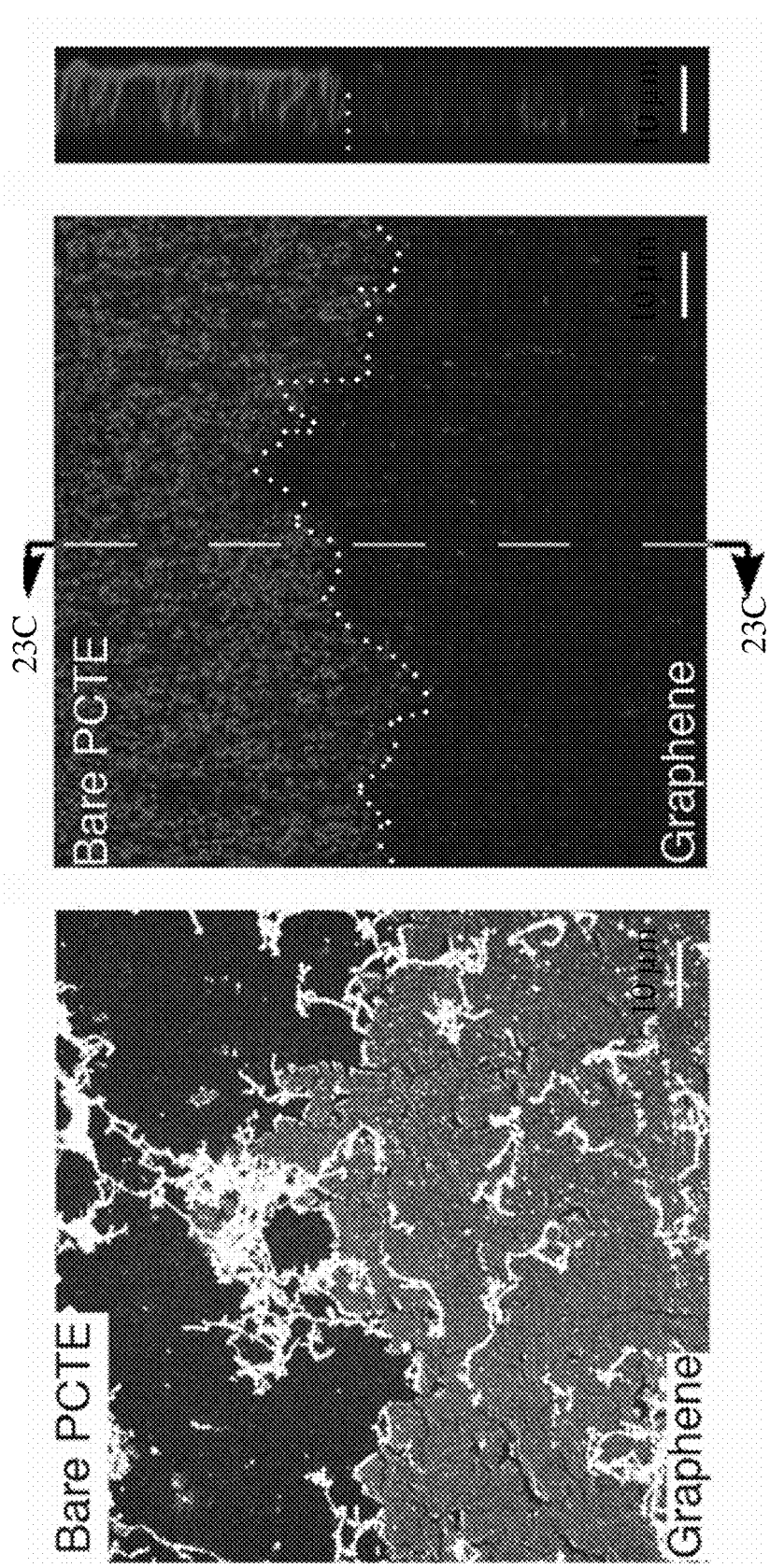
FIG. 23A is a visible light microscopy image of graphene including a defect on a PCTE after an interfacial reaction.
FIG. 23B is fluorescence microscopy image of graphene including a defect on a PCTE after an interfacial reaction, where the interfacial polymer is fluorescently labeled.
FIG. 23C is a fluorescence microscopy image of a cross section taken along line 23C of FIG. 23B.
Figure 23D:
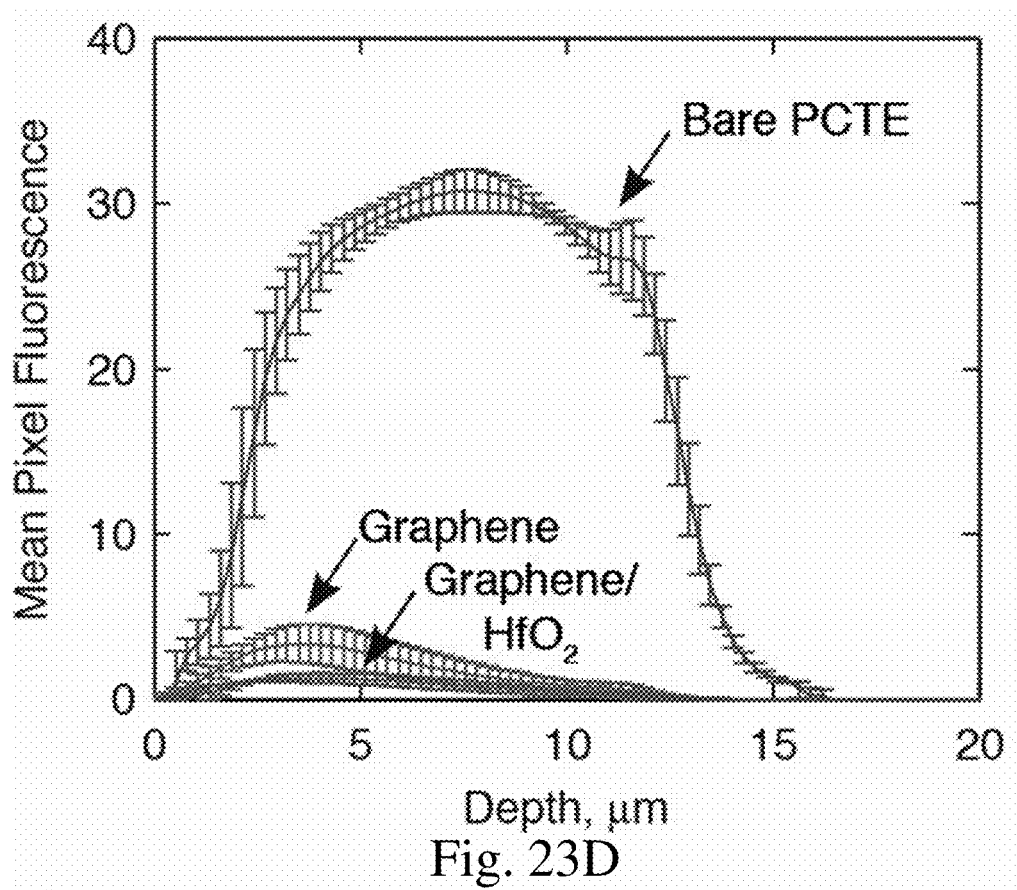
FIGS. 23D-23E are graphs of mean pixel fluorescence values for interfacial polymerization on bare PCTE, Graphene on PCTE, and Graphene on PCTE treated with $HfO_2$ ALD where the interfacial polymer is fluorescently labeled.
Figure 23E:
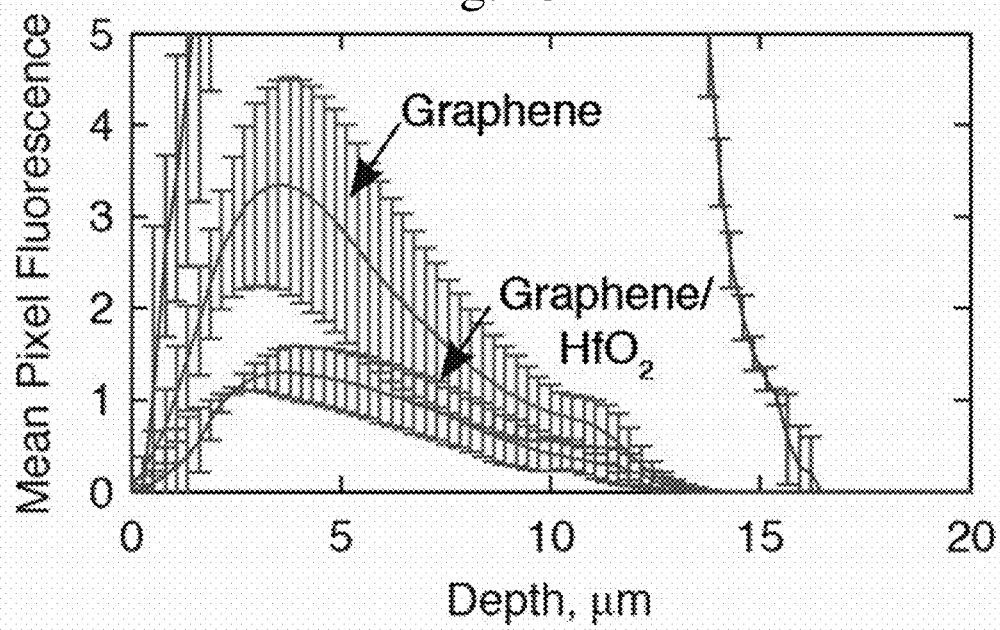
Figure 23F:
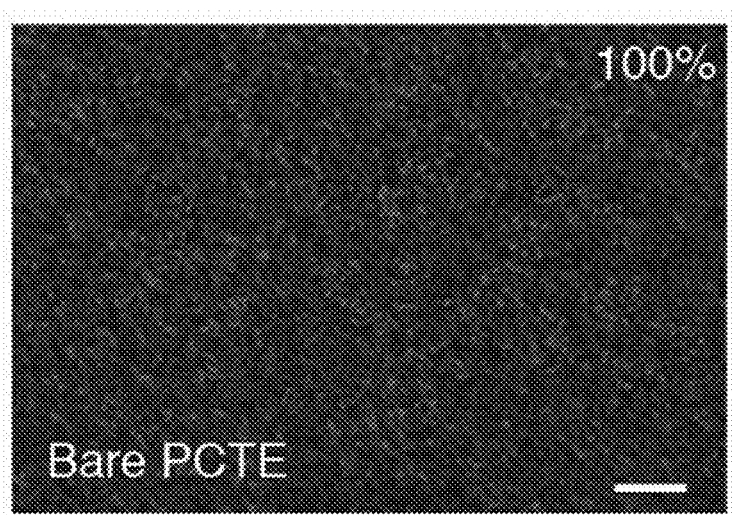
FIG. 23F-23H are fluorescence microscopy images corresponding to FIGS. 23D-23E.
Figure 23G:
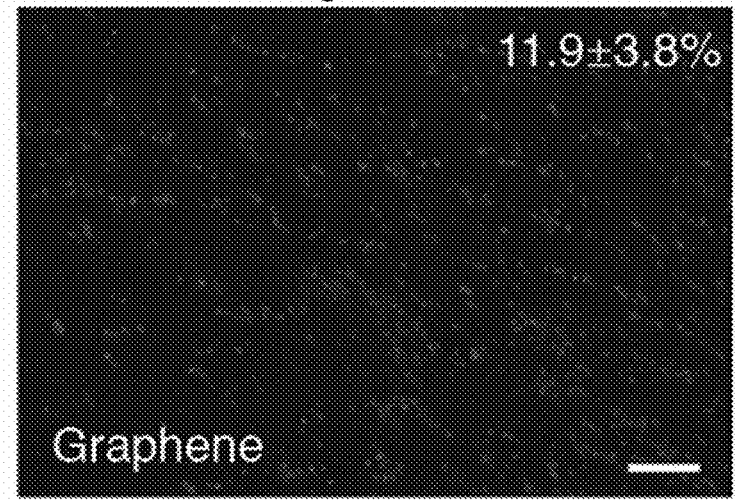
Figure 23H:
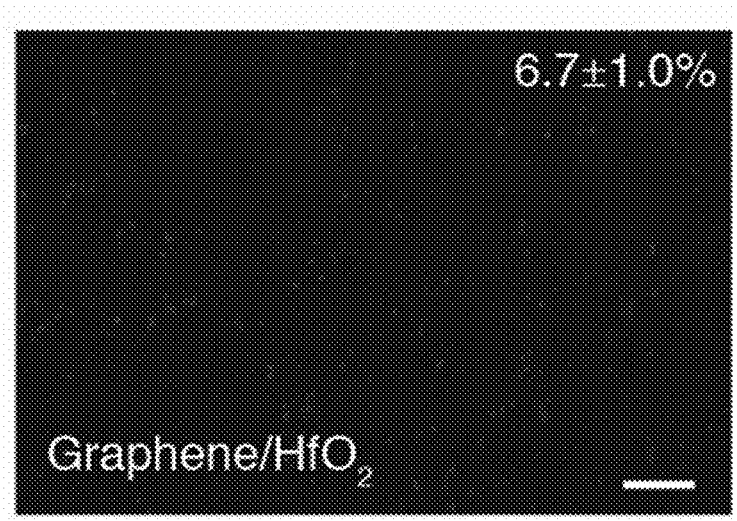

In one set of experiments, graphene membranes were sealed using nylon 6,6 formed by the reaction between APC (5 mg/mL) and HMDA (5 mg/mL). Labeling the HMDA with a fluorescent dye (Texas Red-X Succinimidyl Ester, Life Technologies) enabled the visualization of the position of the synthesized polymer through confocal fluorescence microscopy. A reflected light image and fluorescence images of the graphene membrane reveal that fluorescently-labeled nylon 6,6 preferentially forms where graphene does not cover the PCTE pores, see FIGS. 23A-23C. Additionally, an analysis of the mean pixel florescence of the sample area revealed that when graphene is present on the surface of the PCTE membrane, the amount of polymer coverage is significantly reduced to about 12% of that measured for bare PCTE, see FIGS. 23D and 23E. This reduction indicates that graphene blocks the precipitation reaction unless defects permit it. However, when polymer does form behind the graphene, it does so nearer the graphene, suggesting the occurrence of intrinsic defects permitting small amounts of the HMDA to leak across the graphene into the organic side. As also shown by the figures, covering these intrinsic defects with hafnium oxide via atomic layer deposition further reduces polymer formation as compared to the bare PCTE by about an additional 5%. FIGS. 23F-23H are fluorescent images of a bare PCTE membrane, a graphene membrane, and a graphene membrane with HfO$_2$ deposition using the above noted fluorescent labeled nylon 6,6.

Example: Water Permeability

In another set of experiments, the permeability of water across the membrane described in the previous example under forward osmosis with a draw solution of 20 atm glycerol ethoxylate was measured. The membrane was formed by transfer of graphene, ALD of hafnia, interfacial polymerization using HMDA and APC but without fluorescent label, and pore creation by ion bombardment and oxidative etching. To measure the permeability, a graduated cylinder was affixed to the side of the diffusion cell containing deionized water and monitored over the course of the experiment (20-40 min). Accounting for the exposed area of the membrane, the permeability of the nanoporous graphene was found to be 0.88±0.19 L m$^{-2}$ h$^{-1}$ bar$^{-1}$. The experimental permeability agreed with theoretical predictions within an order of magnitude.

Example: Salt and Organic Molecule Flux Rates

In yet another set of experiments, the flux of salts and organic molecules using the membrane described in the previous example was measured under forward osmosis with a draw solution of 20 atm glycerol ethoxylate. Water permeability was calculated using the same procedure as described above. The concentration of the salts in the deionized water side were measured over time using a conductivity probe (eDAQ IsoPod), while the concentration of the organic molecules were measured over time using a UV-vis spectrophotometer (Cary 60). The measured ions and molecules were NaCl (~0.72 nm), MgSO$_4$ (~0.8 nm), Allura Red AC (~1.0 nm), and 4.4 kDa Tetramethylrhodamine Dextran (~2.3 nm).

Figure 24:
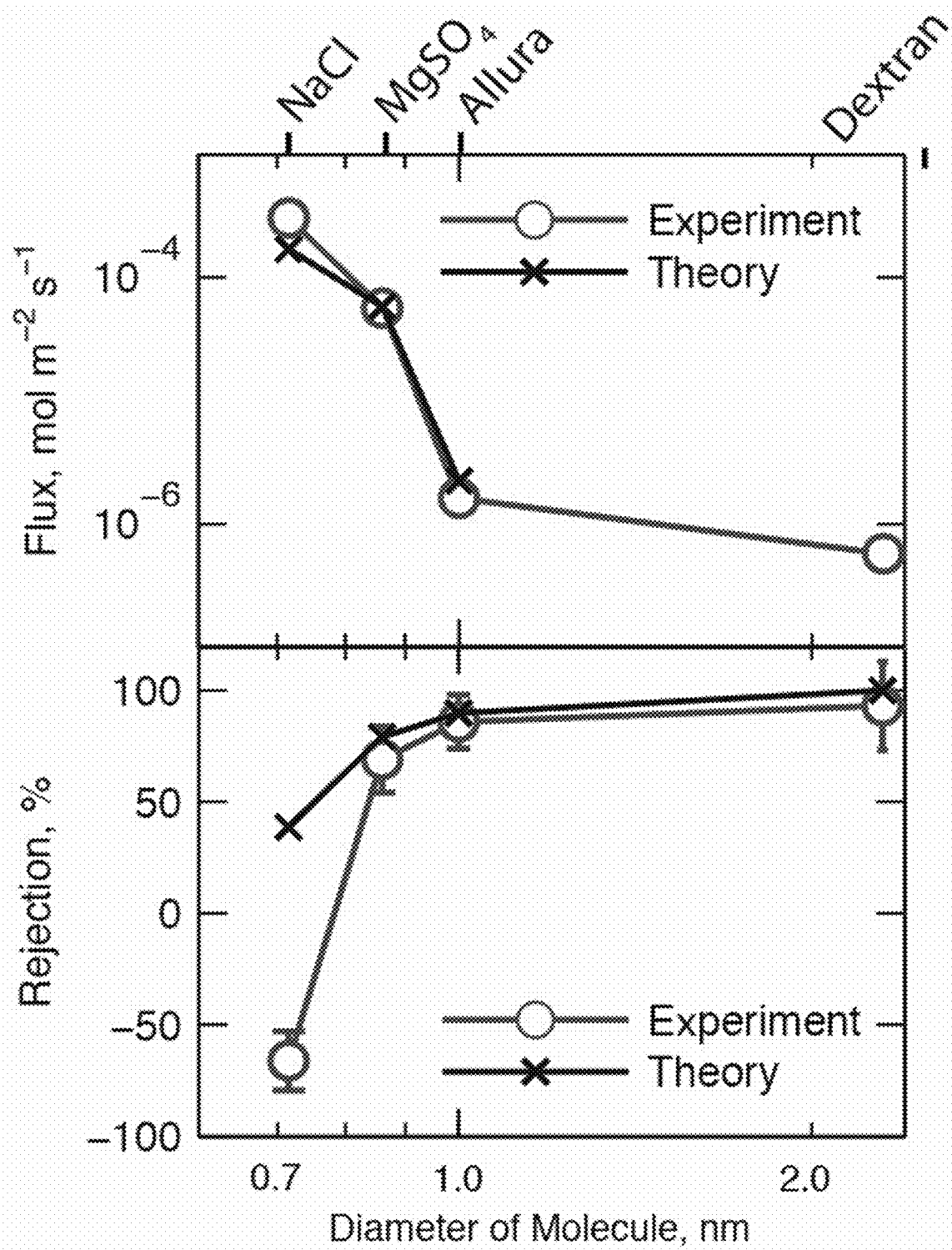
FIG. 24 is a graph of the flux and rejection rates for a composite membrane for various sized molecules and ions.

As shown in FIG. 24, the composite membrane rejects the flow of large organic molecules, but allows for the transport of monovalent salts. The negative rejection, as defined as $1-\dot{n}_{sol}/\dot{n}_{sol}^o$, where $\dot{n}_{sol}$ is the experimentally measured solute flux and $\dot{n}_{sol}^o$ is the solute flux were the membrane non-selective, of the monovalent sodium chloride indicates that leakage is still present. Qualitatively, the experimental mass flux agrees with the theoretical predictions.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A method of forming a membrane, the method comprising:
    depositing a first material onto a surface of a porous substrate, wherein the first material is less hydrophilic than the porous substrate; and
    bonding an atomically thin active layer to the first material to bond the atomically thin active layer to the porous substrate, wherein the first material is disposed between the atomically thin active layer and the porous substrate, wherein the atomically thin active layer includes a first plurality of open pores, and wherein the porous substrate includes a second plurality of open pores that pass through the porous substrate and the first material such that the first plurality of pores and the second plurality of pores are in fluid communication such that a gas and/or liquid is capable of flowing through the membrane.

2. The method of claim 1, wherein the atomically thin active layer comprises at least one of graphene, hexagonal boron nitride, molybdenum sulfide, vanadium pentoxide, silicon, doped-graphene, graphene oxide, hydrogenated graphene, fluorinated graphene, a covalent organic framework, a layered transition metal dichalcogenide, a layered Group-IV and Group-III metal chalcogenide, silicene, germanene, and a layered binary compound of a Group IV element and a Group III-V element.

3. The method of claim 1, wherein the atomically thin active layer includes a plurality of defects in fluid communication with a portion of the second plurality of pores of the porous substrate, and further comprising depositing a second material in the portion of the second plurality of pores in fluid communication with the plurality of defects of the atomically thin active layer to at least partially fill the portion of the second plurality of pores.

4. The method of claim 3, wherein the second material comprises at least one of alumina, ruthenium oxide, zinc oxide, titania, zirconia, and hafnia.

5. The method of claim 3, wherein the second material deposited in the portion of the second plurality of pores increases a flow resistance of the portion of the second plurality of pores.

6. The method of claim 1, further comprising modifying the porous substrate by plasma treating the porous substrate, irradiating the porous substrate with electrons and/or photons, modifying the porous substrate with one or more functional groups, and/or grafting a polymer onto the porous substrate to decrease leakage therethrough.

7. The method of claim 6, wherein the modified porous substrate is bonded to the first material.

8. The method of claim 6, wherein a portion of the second plurality of pores of the modified porous substrate are uncovered by the atomically thin active layer, and further comprising reacting the modified porous substrate with one or more materials configured to block leakage through the portion of the second plurality of pores of the modified porous substrate that are uncovered by the atomically thin active layer.

9. The method of claim 1, wherein the first material is deposited using atomic layer deposition.

10. The method of claim 1, wherein the membrane is permeable.

11. A membrane comprising:
a porous substrate;
a first layer comprising a first material disposed on at least a portion of a surface of the porous substrate, wherein the first material is less hydrophilic than the porous substrate; and
an atomically thin active layer disposed on the first layer, wherein the atomically thin active layer includes a first plurality of open pores, and wherein the porous substrate includes a second plurality of open pores that pass through the porous substrate and the first material such that the first plurality of pores and the second plurality of pores are in fluid communication such that a gas and/or liquid is capable of flowing through the membrane.

12. The membrane of claim 11, wherein the atomically thin active layer comprises at least one of graphene, hexagonal boron nitride, molybdenum sulfide, vanadium pentoxide, silicon, doped-graphene, graphene oxide, hydrogenated graphene, fluorinated graphene, a covalent organic framework, a layered transition metal dichalcogenide, a layered Group-IV and Group-III metal chalcogenide, silicene, germanene, and a layered binary compound of a Group IV element and a Group III-V element.

13. The membrane of claim 11, further comprising a second material deposited in a plurality of pores of the porous substrate connected with a plurality of defects of the atomically thin active layer to at least partially fill the plurality of pores of the porous substrate.

14. The membrane of claim 13, wherein the second material comprises at least one of alumina, ruthenium oxide, zinc oxide, titania, zirconia, and hafnia.

15. The membrane of claim 13, wherein a thickness of the second material deposited in the plurality of pores of the porous substrate is selected to provide a desired flow resistance of the porous substrate.

16. The membrane of claim 11, wherein the atomically thin active layer comprises a plurality of atomically thin active layers.

17. The membrane of claim 16, further comprising pores in the plurality of atomically thin active layers that are substantially aligned with one another.

18. The membrane of claim 11, wherein the first material is a nanomaterial, wherein the first material is different than a material of the atomically thin active layer.

19. The membrane of claim 11, further comprising a protective layer disposed on the atomically thin active layer.

20. The membrane of claim 19, wherein the protective layer is an anti-fouling layer.

21. The membrane of claim 11, wherein the first plurality of open pores are functionalized.

22. The membrane of claim 11, wherein the first material is an atomic layer deposited material, wherein the first material is different than a material of the atomically thin active layer.

23. The membrane of claim 11, wherein the membrane is permeable.

24. A membrane comprising:
a porous substrate;
a first layer comprising a first material disposed on at least a portion of a surface of the porous substrate; and
an atomically thin active layer disposed on the first layer, wherein a bond between the atomically thin active layer and the substrate with the first layer is improved relative to a bond between the atomically thin active layer and the substrate without the first layer, wherein the atomically thin active layer includes a first plurality of open pores, and wherein the porous substrate includes a second plurality of open pores that pass through the porous substrate and the first material such that the first plurality of pores and the second plurality of pores are in fluid communication such that a gas and/or liquid is capable of flowing through the membrane, and wherein the first material is different than a material of the atomically thin active layer.

25. The membrane of claim 24, wherein the first material is less hydrophilic than the porous substrate.

* * * * *